(12) United States Patent
Jang et al.

(10) Patent No.: US 9,502,132 B2
(45) Date of Patent: Nov. 22, 2016

(54) MULTI LEVEL ANTIFUSE MEMORY DEVICE AND METHOD OF OPERATING THE SAME

(71) Applicant: SAMSUNG ELECTRONICS CO., LTD., Suwon-si, Gyeonggi-do (KR)

(72) Inventors: Min-Soo Jang, Seoul (KR); Young-hun Seo, Hwaseong-si (KR); Chan-yong Lee, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 273 days.

(21) Appl. No.: 13/912,649

(22) Filed: Jun. 7, 2013

(65) Prior Publication Data

US 2014/0022855 A1    Jan. 23, 2014

(30) Foreign Application Priority Data

Jul. 19, 2012   (KR) .......................... 10-2012-0078955

(51) Int. Cl.
| G11C 7/06 | (2006.01) |
| G11C 17/16 | (2006.01) |
| G11C 17/18 | (2006.01) |
| G11C 11/56 | (2006.01) |

(52) U.S. Cl.
CPC ........... G11C 17/16 (2013.01); G11C 11/5692 (2013.01); G11C 17/18 (2013.01); *G11C 2211/563* (2013.01); *G11C 2211/5624* (2013.01)

(58) Field of Classification Search
CPC ............... G11C 17/16; G11C 11/5692; G11C 17/18; G11C 2211/563; G11C 2211/5624

USPC ................. 365/96, 189.07, 189.09, 225.7
See application file for complete search history.

(56) References Cited

U.S. PATENT DOCUMENTS

| 6,788,607 | B2 * | 9/2004 | Duval ............... | G11C 17/18 |
| | | | | 365/189.07 |
| 7,206,214 | B2 | 4/2007 | Hoefler et al. | |
| 7,224,633 | B1 * | 5/2007 | Hovis ............... | G11C 17/18 |
| | | | | 365/207 |
| 7,724,600 | B1 * | 5/2010 | Im ................... | G11C 17/18 |
| | | | | 365/225.7 |
| 7,804,352 | B2 | 9/2010 | Sung et al. | |
| 2006/0054952 | A1 | 3/2006 | Schoellkopf et al. | |
| 2010/0054048 | A1 | 3/2010 | Cheng et al. | |
| 2010/0164603 | A1 | 7/2010 | Hafez et al. | |

FOREIGN PATENT DOCUMENTS

| KR | 1020080041189 | 5/2008 |
| KR | 1020100082046 | 7/2010 |

* cited by examiner

*Primary Examiner* — Tha-O H Bui
(74) *Attorney, Agent, or Firm* — F. Chau & Associates, LLC

(57) ABSTRACT

An antifuse memory device includes an antifuse memory cell, a reference current generation unit, and a comparison unit. The antifuse memory cell includes an antifuse. The reference current generation unit provides a reference current selected from a plurality of reference currents. The comparison unit compares an intensity of a cell current flowing through the antifuse with an intensity of the reference current and provides an output signal corresponding to a result of the comparison.

32 Claims, 10 Drawing Sheets

MULTI LEVEL ANTIFUSE MEMORY DEVICE AND METHOD OF OPERATING THE SAME

CROSS-REFERENCE TO RELATED APPLICATIONS

This application claims priority to Korean Patent Application No. 10-2012-0078955, filed on Jul. 19, 2012, in the Korean Intellectual Property Office, the disclosure of which is incorporated herein in its entirety by reference.

BACKGROUND

1. Technical Field

The inventive concept relates to an antifuse, and more particularly, to an antifuse memory device capable of storing a plurality of bits, and a method of programming and reading the same.

2. Discussion of Related Art

An antifuse is an electrical device that performs a function that is opposite to that of a fuse. Whereas a fuse starts with a low resistance and is designed to break an electrically conductive path, an antifuse starts with a high resistance and is designed to create an electrically conductive path when the voltage across the antifuse exceeds a certain level. A high voltage is applied to a dielectric substance within the antifuse, which causes the dielectric substance to breakdown, thereby enabling current to flow through the antifuse. A detected level of the current flowing through the antifuse can be used to read a logical value of a single bit stored in the antifuse. However, since the method used to breakdown the dielectric substance is imprecise, the antifuse is unable to store a plurality of bits.

SUMMARY

At least one embodiment of the inventive concept provides a multi level antifuse memory device capable of storing a plurality of bits in one antifuse memory cell.

At least one embodiment of the inventive concept also provides a programming and reading method performed by a multi level antifuse memory device that is capable of storing a plurality of bits in one antifuse memory cell.

According to an exemplary embodiment of the inventive concept, an antifuse memory device includes: an antifuse memory, a reference current generation unit, and a comparison unit. The antifuse memory cell includes an antifuse. The reference current generation unit is for providing a reference current selected from among a plurality of reference currents. The comparison unit is for comparing an intensity of a cell current flowing through the antifuse with an intensity of the reference current and providing an output signal corresponding to a result of the comparing.

The antifuse memory device may further include: a reference current selection unit for selecting the reference current to correspond to a value of a plurality of bits to be programmed to the antifuse from among the plurality of reference currents.

The antifuse memory device may further include: a voltage generation unit and control unit. The voltage generation unit is for applying a destruction voltage to a first terminal of the antifuse memory cell in a program operating mode. The control unit is for controlling the voltage generation unit to prevent the destruction voltage from being applied to the first terminal of the antifuse memory cell when the intensity of the cell current is higher than the intensity of the reference current based on the output signal.

The control unit may control the voltage generation unit to apply a read voltage to the first terminal of the antifuse memory cell, and indicate or confirm whether the plurality of bits is programmed to the antifuse memory cell.

The reference current generation unit may include a plurality of resistors corresponding to the plurality of reference currents, wherein the antifuse to which the plurality of bits are programmed has a resistance value lower than a resistance value of a resistor corresponding to the selected reference current.

According to an exemplary embodiment of the inventive concept, an antifuse memory device includes: an antifuse memory cell, a reference current generation unit, and a comparison unit. The antifuse memory cell includes an antifuse and a cell transistor connected to the antifuse. The reference current generation unit includes a reference resistance unit and a replica cell transistor connected to the reference resistance unit and having a same electrical characteristic as the cell transistor, and is for providing a reference current determined according to a resistance value of the reference resistant unit. The comparison unit is for comparing an intensity of a cell current flowing through the antifuse with an intensity of the reference current and providing an output signal corresponding to a result of the comparing.

The antifuse memory device may further include: at least one address selection transistor connected to the antifuse memory cell and for addressing the antifuse memory cell, wherein the reference current generation unit further includes at least one replica selection transistor connected to the replica cell transistor, and having a same electrical characteristic as the at least one address selection transistor.

The cell transistor and the replica cell transistor may have the same transconductance.

The antifuse memory device may further include: a first node to which a destruction voltage is applied in a program operating mode and a read voltage is applied in a read operating mode; and a second node to which a ground voltage is applied, wherein the antifuse and the cell transistor are connected in series to each other between the first node and the second node, wherein the reference resistance unit and the replica cell transistor are connected in series to each other between the first node and the second node.

The antifuse may include a metal oxide semiconductor (MOS) transistor including a gate connected to the first node, a floating drain, and a source connected to the cell transistor.

The antifuse memory device may further include: a switching transistor configured to connect the first node to the gate of the antifuse.

The reference current generation unit may further include: a replica switching transistor connected between the reference resistance unit and the first node and having a same electrical characteristic as the switching transistor.

The reference resistance unit may include a plurality of resistors and a plurality of switches connected in series to the plurality of resistors, the plurality of resistors connected in parallel through the plurality of switches, wherein each of the plurality of switches includes a transistor having a same electrical characteristic as the switching transistor.

The switching transistor may be short-circuited such that the destruction voltage is applied to the gate of the antifuse in the program operating mode, and is open when an intensity of a cell current is higher than an intensity of a reference current based on the output signal.

The voltage level of the destruction voltage may be gradually increased after the switching transistor is short-circuited until the intensity of the cell current is higher than intensity of the reference current.

The reference resistance unit may have a program resistance value selected from a plurality of program resistance values, wherein the antifuse destroyed in the program operating mode has a resistance value lower than the selected program resistance value.

The antifuse memory device may further include: a resistance selection unit for selecting a program resistance value corresponding to a value of a plurality of bits to be programmed to the antifuse from the plurality of program resistance values according to the value of the plurality of bits, wherein the value of the plurality of bits is programmed to the antifuse when the antifuse has a resistance value lower than the program resistance value corresponding to the value of the plurality of bits.

n bit data may be programmed to the antifuse, and the reference resistance unit has a program resistance value from among a $2^n-1$ number of program resistance values, where n is 2 or a natural number greater than 2.

The reference resistance unit may include a plurality of read resistors where a read resistance value is selected based on the read resistors in the read operating mode.

The antifuse memory device may further include: a resistance selection unit and an encoder unit. The resistance selection unit may be for selecting at least one read resistance value from the plurality of read resistance values to read the value of the plurality of bits programmed to the antifuse in the read operating mode. The encoder unit may be for reading and outputting the value of the plurality of bits programmed to the antifuse based on output signals indicating results of comparing a resistance value of the antifuse with the selected at least one read resistance value.

The reference current generation unit may provide a plurality of read reference currents, wherein the comparison unit compares the intensity of the cell current with intensities of the plurality of read reference currents, and provides outputs signals corresponding to results of the comparing. The reference current generation unit may further include: an encoder unit for reading and outputting the value of the plurality of bits programmed to the antifuse based on the output signals.

The comparison unit may include a first current mirror for current-mirroring the cell current and generating a first current, a second current mirror for current-mirroring the reference current and generating a second current, and a third current mirror for current-mirroring the second current and generating a third current. The comparison unit may provide the output signal determined according to whether the first current is higher or lower than the third current.

The comparison unit may include a first current mirror for current-mirroring the cell current and generating a first current, a second current mirror for current-mirroring the reference current and generating a second current, a third current mirror for current-mirroring the second current and generating a third current, a fourth current mirror for current-mirroring the reference current and generating a fourth current, a fifth current mirror for current-mirroring the cell current and generating a fifth current, a sixth current mirror for current-mirroring the fifth current and generating a sixth current, and a comparator for comparing a first output signal determined according to whether the first current is higher or lower than the third current and a second output signal determined according to whether the fourth current is higher or lower than the sixth current. The comparison unit may output the output signal.

According to an exemplary embodiment of the inventive concept, an antifuse memory device includes: an antifuse memory cell, a reference voltage generation unit, a comparison unit, and an encoder unit. The antifuse memory cell includes an antifuse connected to a source resistor through a first node. The reference voltage generation unit is for generating a plurality of reference voltages. The comparison unit is for comparing a voltage of the first node with the plurality of reference voltages. The encoder unit is for reading and outputting a value of a plurality of bits programmed to the antifuse memory cell based on results of the comparing.

According to an exemplary of the inventive concept, a method of operating an antifuse memory device includes: selecting a resistor from a reference resistance unit including a plurality of resistors; applying a first voltage to an antifuse memory cell including an antifuse; applying the first voltage to a reference current generation unit including the reference resistance unit and generating a reference current corresponding to the selected resistor; and comparing an intensity of a cell current flowing through the antifuse with an intensity of the reference current. The first voltage may be sufficient to cause dielectric breakdown of the antifuse. The method may further include halting application of the voltage to the antifuse memory when a result of the comparing indicates the intensity of the cell current is higher than the reference current. The selected resistor may indicate a multi-bit pattern to be programmed to the antifuse memory cell.

According to an exemplary embodiment of the inventive concept, an antifuse memory device includes a voltage generation unit, an antifuse memory cell, a reference current generation unit, and a control unit. The voltage generation unit is configured to output a programming voltage to program the antifuse memory cell with a multi-bit pattern. The antifuse memory cell includes an antifuse configured to receive the output. The reference current generation unit is configured to receive the output and select one of a plurality of reference currents, where each reference current indicates a different multi-bit pattern. The control unit is configured to prevent application of the programming voltage to the antifuse when the cell current is larger than the one reference current. The programming voltage is at a level sufficient to cause dielectric breakdown within the antifuse. The voltage generation unit may be further configured to output a read voltage at a level that is insufficient to cause the dielectric breakdown to read the programmed multi-bit pattern.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
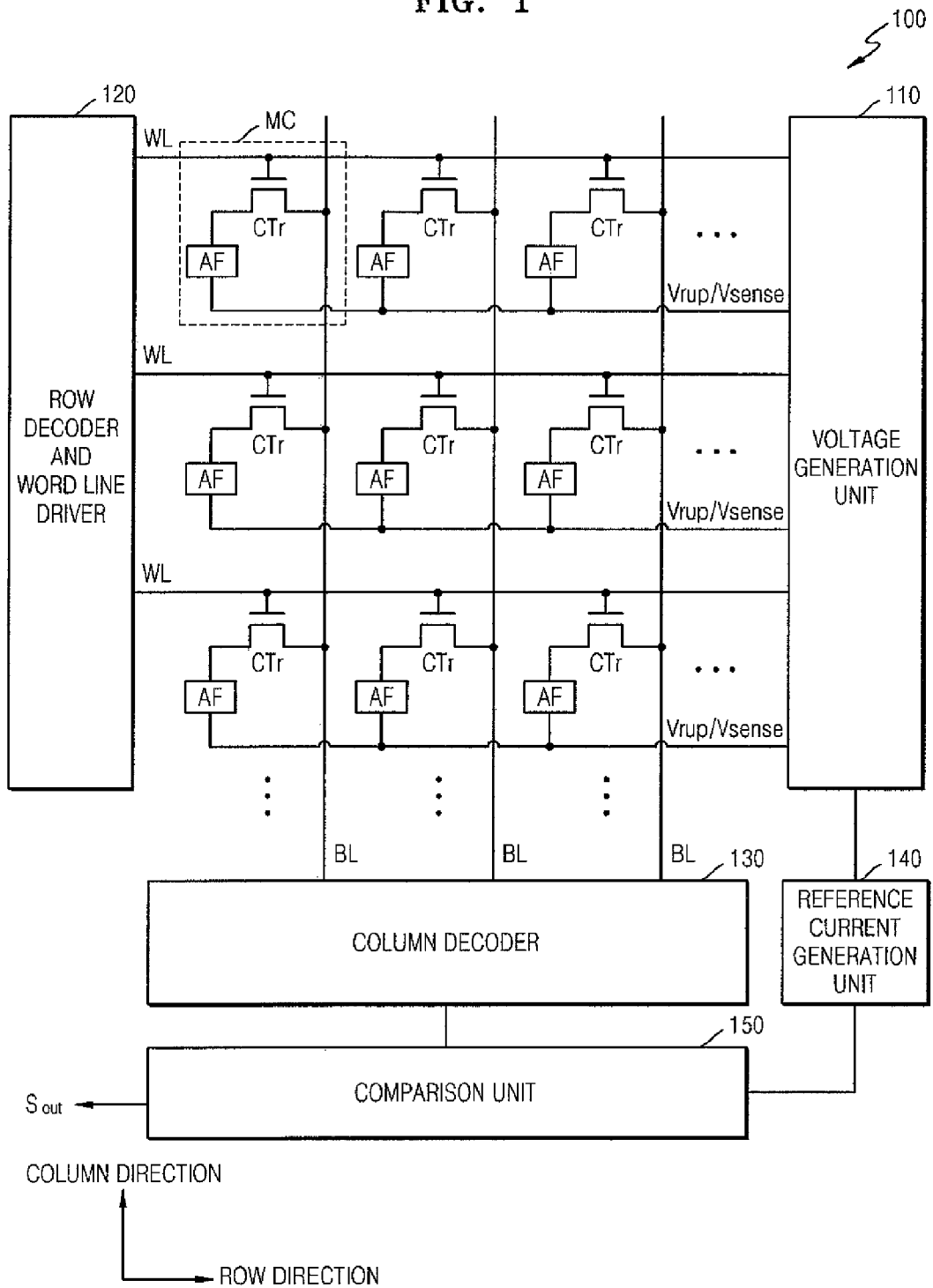
FIG. 1 is a schematic block diagram illustrating an antifuse memory device according to an exemplary embodiment of the inventive concept.

The inventive concept will now be described more fully with reference to the accompanying drawings, in which exemplary embodiments of the inventive concept are shown. It should be understood, however, that there is no intent to limit exemplary embodiments of the inventive concept to the particular forms disclosed, but conversely, exemplary embodiments of the inventive concept are to cover all modifications, equivalents, and alternatives falling within the spirit and scope of the inventive concept.

Like reference numerals denote like elements in the drawings. In the attached drawings, sizes of structures may be exaggerated for clarity. As used herein, the singular forms "a", "an", and "the" are intended to include the plural forms as well, unless the context clearly indicates otherwise.

FIG. 1 is a schematic block diagram illustrating an antifuse memory device 100 according to an exemplary embodiment of the inventive concept.

Referring to FIG. 1, the antifuse memory device 100 includes an array of antifuse memory cells MC arranged in a row direction and in a column direction, word lines WL connected to the antifuse memory cells MC in the row direction, and bit lines BL connected to the antifuse memory cells MC in the column direction. The antifuse memory cells MC include antifuses AF and cell transistors CTr. The antifuse AF is a device in which current does not flow through both ends when it is open but the current flows when it is short-circuited after a dielectric material therein is destroyed or partially destroyed (e.g., undergoes dielectric breakdown). When the dielectric material within an antifuse has undergone dielectric breakdown, the antifuse may be referred to as "destroyed". The antifuse AF is a device having a very large or infinite resistance value before being destroyed and a predetermined resistance value or relatively low resistance value after being destroyed or partially destroyed. Destruction of the antifuse AF may be determined according to whether current having a predetermined intensity flows through the antifuse AF. This determination may be used to store or program data (e.g., a logic 0 or 1) in the antifuse AF. Unlike a memory device such as DRAM or flash memory, the antifuse AF may not be restored to its state before destruction, and thus the antifuse AF is programmable just one time. Therefore, the antifuse memory device 100 may be referred to as a one-time programmable read only memory.

The antifuse AF may be implemented as a metal oxide semiconductor (MOS) transistor. The MOS transistor includes a gate dielectric and a gate stacked on a semiconductor substrate, and a source and a drain disposed at both sides of the gate and disposed in the semiconductor substrate. The MOS transistor used as the antifuse AF may include a floating drain, a gate connected to the voltage generation unit 110, and a source connected to a drain of the cell transistor CTr. As described above, no current flows in the antifuse AF before it is destroyed due to a gate dielectric between the gate and the source. However, if the gate dielectric is destroyed (e.g., undergoes a full or partial dielectric breakdown) by applying a high voltage between the gate and the source, current flows between the gate and the source. The drain of the antifuse AF is floating, and thus the antifuse AF functions as a 2-terminal device including the gate and the source. The gate of the antifuse AF is referred to as a first terminal, and the source thereof is referred to as a second terminal.

According to an exemplary embodiment of the inventive concept, the antifuse AF is a depletion type MOS transistor connected to the source and the drain. In an initial state, a resistance between a first node connected to the gate and a second node commonly connected to the gate and the source/drain is very high since the gate and the source/drain are separated from each other by a gate dielectric layer. An antifuse circuit destroys the gate dielectric layer by applying a breakdown voltage between the first node and the second node, and thus the antifuse circuit may be irreversibly changed from a non-conductive state to a conductive state. If the gate dielectric layer is destroyed, the resistance between the first node and the second node becomes low.

The cell transistors CTr includes gates connected to the word lines WL, sources connected to the bit lines BL, and drains connected to the second terminals of the antifuses AF. The cell transistors CTr are controlled by word line signals provided through the word lines WL.

A row decoder and word line driver 120 receives an address signal, in particular, a row address signal, decodes the address signal, and enables the word line WL corresponding to the address signal. The cell transistor CTr connected to the enabled word line WL is turned on.

The voltage generation unit 110 generates a destruction voltage Vrup or a read voltage Vsense according to an operating mode of the antifuse memory device 100, and applies the destruction voltage Vrup or the read voltage Vsense to the first terminal of the antifuse AF. In a program operating mode, the voltage generation unit 110 applies the destruction voltage Vrup to the first terminal of the antifuse AF. In a read operating mode, the voltage generation unit 110 applies the read voltage Vsense to the first terminal of the antifuse AF. The destruction voltage Vrup may be between about 5 V and about 8V. For example, the destruction voltage Vrup may be between about 5.5 V and about 6 V. Also, the read voltage Vsense may be between about 2 V and about 4 V and lower than the destruction voltage Vrup. For example, the read voltage Vsense may be about 3V. However, the destruction voltage Vrup and read voltage Vsense are not limited to the examples discussed above, and may differ based on the dielectric used. In an exemplary embodiment, the destruction voltage Vrup gradually increases after destruction of the dielectric of the antifuse AF has started. For example, the destruction voltage Vrup could be 5.5 V in an initial destruction operation of the antifuse AF, and afterwards the destruction voltage Vrup may be increased to 6 V or a voltage level higher than 6 V over time.

In an embodiment where the cell transistor CTr is turned on, and the second terminal of the antifuse Af is connected to the bit line BL, the destruction voltage Vrup destroys the dielectric of the antifuse Af to cause current to flow through the antifuse Af, and the read voltage Vsense allows a predetermined current to flow through the bit line BL via the destroyed antifuse AF.

A column decoder 130 receives an address signal (e.g., a column address signal), decodes the address signal, and selects the bit line BL corresponding to the address signal. The column decoder 130 may ground the selected bit line BL to complete a current path, and float the bit lines BL that are not selected.

A comparison unit 150 receives a cell current that flows through the bit line BL selected by the column decoder 130. The comparison unit 150 receives a reference current for comparing an intensity of the cell current. The reference current may be provided by a reference current generation unit 140. The reference current generation unit 140 receives the destruction voltage Vrup or the read voltage Vsense from the voltage generation unit 110. Also, the reference current generation unit 140 may provide reference currents having various intensities.

The comparison unit 150 compares the intensity of the cell current with the intensity of the reference current and provides an output signal Sout corresponding to a comparison result. For example, the output signal Sout may have a high level when the intensity of the cell current is lower than the intensity of the reference current, and have a low level when the intensity of the cell current is higher than the intensity of the reference current. The comparison unit 150 may compare the intensity of the cell current with intensities of a plurality of reference currents and provide a plurality of the output signals Sout.

Figure 2:
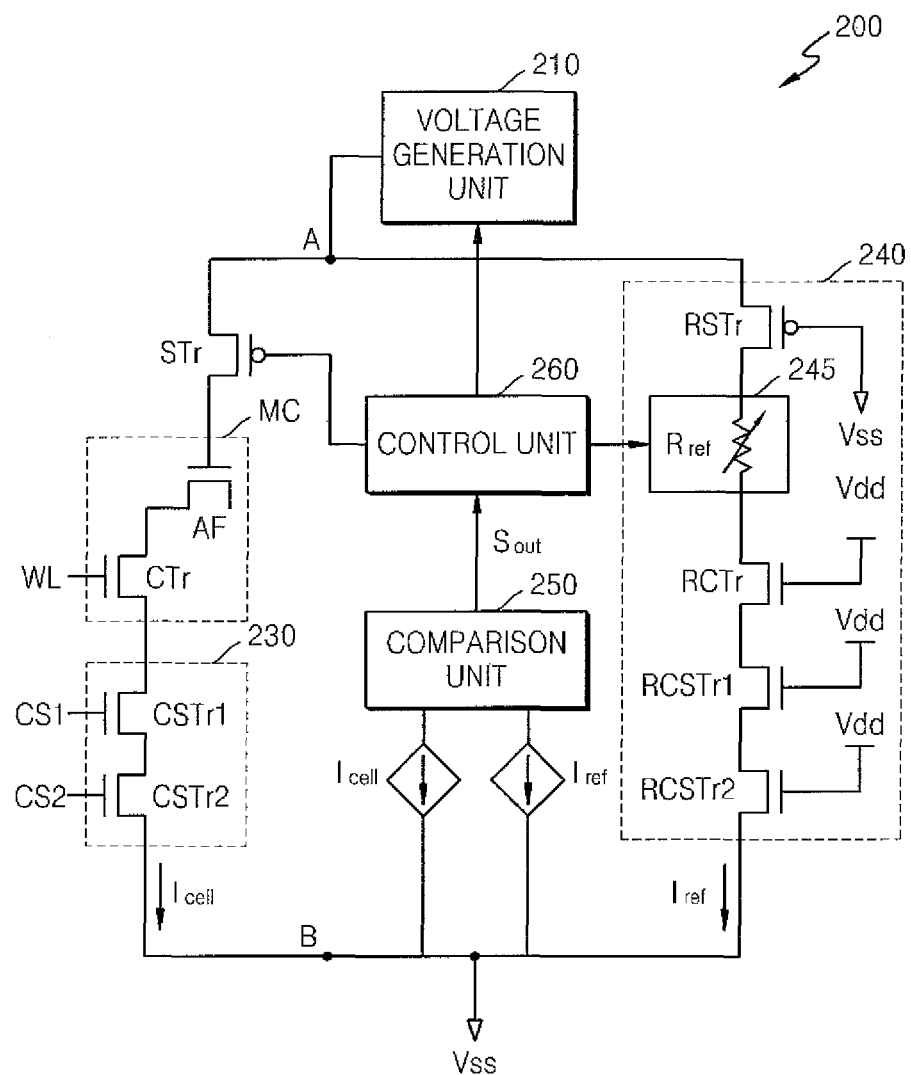
FIG. 2 is a schematic block diagram illustrating an antifuse memory device according to an exemplary embodiment of the inventive concept.

FIG. 2 is a schematic block diagram illustrating an antifuse memory device 200 according to an embodiment of the inventive concept.

Referring to FIG. 2, the antifuse memory device 200 includes the antifuse memory cell MC, a switching transistor STr connected in series to the antifuse memory cell MC between a first node A and a second node B, address selection transistors CSTr1 and CSTr2, a reference current generation unit 240, a comparison unit 250, and a control unit 260 that are connected between the first node A and the second node B, and a voltage generation unit 210.

The antifuse memory cell MC includes the antifuse AF and the cell transistor CTr controlled by a voltage level of the word line WL. The antifuse memory cell MC may be connected to the first node A through the switching transistor STr. The voltage generation unit 210 applies the destruction voltage Vrup or the read voltage Vsense to the first node A. The switching transistor STr is controlled by the control unit 260. According to an exemplary embodiment, the switching transistor STr is controlled by the output signal Sout.

The antifuse memory cell Mc may be connected to the second node B by the address selection transistors CSTr1 and CSTr2 included in a column decoder 230. The second node B may be grounded or a ground voltage Vss may be applied thereto. The two address selection transistors CSTr1 and CSTr2 are shown in FIG. 2 but the inventive concept is not limited to the illustrated number of the address selection transistors CSTr1 and CSTr2. The number of the address selection transistors CSTr1 and CSTr2 may be three or more or may be one. The address selection transistors CSTr1 and CSTr2 may be controlled by column selection signals CS1 and CS2.

A control transistor (not shown) such as a write-enable transistor or a read-enable transistor may be disposed between the column decoder 230 and the second node B. While FIG. 2 illustrates the switching transistor STr, the antifuse memory cell MC, and the address selection transistors CSTr1 and CSTr2 being connected in series to each other between the first node A and the second node B, the inventive concept is not limited thereto. For example, other transistors may be further added between the first node A and the second node B or some transistors, for example, the switching transistor Str, may be removed therefrom. Also, while in both a program operating mode and a read operating mode, the switching transistor STr, the antifuse memory cell MC, and the address selection transistors CSTr1 and CSTr2 are connected in series to each other between the first node A and the second node B in FIG. 2, the inventive concept is not limited thereto. For example, these connections may be changed according to an operating mode.

Current that flows through the antifuse memory cell MC between the first node A and the second node B is referred to as a cell current Icell. In an embodiment where the antifuse AF is not destroyed, the cell current Icell is 0, whereas in an embodiment where the antifuse AF is destroyed or partially destroyed, the cell current Icell has a predetermined value greater than 0.

The reference current generation unit 240 is connected between the first node A and the second node B, and generates a reference current Iref. The reference current generation unit 240 includes a reference resistance unit 245. The reference resistance unit 245 may have one resistance value Rref selected from a plurality of resistance values. For example, the reference resistant unit 245 may be a variable resistor, a rheostat, a potentiometer, etc.

The reference current generation unit 240 may include a replica cell transistor RCTr having the same electrical characteristic as the cell transistor CTr. A power voltage Vdd is applied to a gate of the replica cell transistor RCTr so that the replica cell transistor RCTr is always turned on. Thus, the replica cell transistor RCTr may have the same source-drain resistance and source-drain voltage as the cell transistor CTr of the antifuse memory cell MC when the cell transistor CTr is turned on. Accordingly, the replica cell transistor RCTr may have the same transconductance gm as the cell transistor CTr. In an exemplary embodiment, the replica cell transistor RCTr has at least one of the same threshold voltage Vt, aspect ratio W/C, and processing parameters as the cell transistor CTr. The aspect ratio W/L indicates a ratio of a channel length L and a channel width W.

Also, the reference current generation unit 240 may further include replica selection transistors RCSTr1 and RCSTr2 having the same electrical characteristics as the address selection transistors CSTr1 and CSTR2, respectively. The power voltage Vdd is applied to gates of the replica selection transistors RCSTr1 and RCSTr2 so that the replica selection transistors RCSTr1 and RCSTr2 are always turned on. Thus, the replica selection transistors RCSTr1 and RCSTr2 may have the same source-drain resistances and source-drain voltages as the address selection transistors CSTr1 and CSTr2 when the address selection transistors CSTr1 and CSTR2 are turned on.

Also, the reference current generation unit 240 may further include a replica switching transistor RSTr having the same electrical characteristic as the switching transistor STr. As shown in FIG. 2, the switching transistor STr and the replica switching transistor RSTr may be a PMOS transistor. The ground voltage Vss is applied to a gate of the replica switching transistor RSTr so that the replica switching transistor RSTr is always turned on. According to an exemplary embodiment, the gate of the replica switching transistor RSTr is connected to a gate of the switching transistor STr so that the replica switching transistor RSTr and the switching transistor STr are controlled in the same way. Thus, the replica switching transistor RSTr may have the same source-drain resistance and source-drain voltage as the switching transistor STr when the switching transistor STr is turned on.

As described above, other transistors may be added to a path between the first node A and the second node B that passes through the antifuse memory cell MC or some transistors may be removed therefrom. Correspondingly, the reference current generation unit 240 may also further include other replica transistors corresponding to the added transistors or exclude transistors corresponding to the removed transistors. For example, the switching transistor STr may be removed between the first node A and the second node B, and correspondingly, the replica switching transistor RSTr may be removed.

In other words, the reference current generation unit 240 includes the reference resistance unit 245 corresponding to the antifuse AF, and replica transistors (for example, the replica cell transistor RCTr, the replica selection transistors RCSTr1 and RCSTr2, and the replica switching transistor RSTr) respectively corresponding to transistors (for example, the cell transistor CTr, the address selection transistors CSTr1 and CSTr2, and the switching transistor STr) connected to the antifuse AF. Thus, in an embodiment where a resistance value of the antifuse AF is greater than a resistance value of the reference resistance unit 245, the cell current Icell is lower than the reference current Iref, whereas in an embodiment where the resistance value of the antifuse AF is smaller than the resistance value of the reference resistance unit 245, the cell current Icell is higher than the reference current Iref. The comparison unit 250 compares an intensity of the cell current Icell with an intensity of the reference current Iref and outputs the output signal Sout corresponding to a comparison result.

For example, in the program operating mode, the comparison unit 250 detects the resistance value of the antifuse AF is smaller than the resistance value of the reference resistance unit 245 according to destruction of a dielectric of the antifuse AF. Also, in the read operating mode, the comparison unit 250 determines whether the resistance value of the antifuse AF is greater or smaller than the resistance value of the reference resistance unit 245. Data stored in the antifuse memory cell MC may be detected based on a result of the determination.

The control unit 260 controls the switching transistor STr, the voltage generation unit 210, and the reference resistance unit 245 according to the operating mode. Also, the control unit 260 receives the output signal Sout from the comparison unit 250.

In the program operating mode, the control unit 260 receives values of data to be programmed to the antifuse AF, i.e. bits. For example, if 2-bit data is to be recorded onto the single antifuse AF, data to be programmed to the antifuse AF may be one of "00", "01", "11", and "10". For example, if 3-bit data is to be recorded onto the single antifuse AF, data to be programmed to the antifuse AF may be one of "000", "001", "011", "110", "111", "101", and "100". The control unit 260 selects a reference resistance value corresponding to a value of data to be programmed, and controls the reference resistance unit 245 to have the reference resistance value. The control unit 260 controls the voltage generation unit 210 to apply the destruction voltage Vrup to the first node A. Also, the control unit 260 may provide the gate of the switching transistor STr with, for example, a low level signal to turn the switching transistor STr on. The control unit 260 may control the voltage generation unit 210 to gradually increase a voltage level of the destruction voltage Vrup.

Although the antifuse AF initially has a very high or infinite resistance value, as the dielectric is destroyed by the destruction voltage Vrup, a resistance value between both ends of the antifuse AF becomes smaller. The resistance value between both ends of the antifuse Af may be referred to as a cell resistance value. If the cell resistance value is smaller than the reference resistance value, the cell current Icell is greater than the reference current Iref. The control unit 260 detects from the output signal Sout that the cell current Icell is smaller than the reference current Iref, turns the switching transistor STr off, and floats a first terminal of the antifuse AF. Thus, the control unit 260 may ensure that the cell current Icell is smaller than the reference current Iref.

Thereafter, the control unit 260 performs a process of determining whether desired data is programmed to the antifuse memory cell MC. The control unit 260 controls the voltage generation unit 210 to apply the read voltage Vsense to the first node A. For example, in an embodiment where the data to be programmed to the antifuse memory cell MC is "01", the control unit 260 may control the reference resistance unit 245 to have a read resistance value corresponding to "01" and receive a comparison result. Also, the control unit 260 may control the reference resistance unit 245 to have a read resistance value corresponding to "11" that has smaller resistance than "01" and receive the comparison result again. If data "01" is normally programmed to the antifuse memory cell MC, the cell resistance value of the antifuse AF may be smaller than the read resistance value corresponding to "01" and may be greater than the read resistance value corresponding to "11". Thus, the control unit 260 may determine whether desired data is programmed to the antifuse memory cell MC, and return a result value indicating that data is normally programmed.

In the read operating mode, in an exemplary embodiment, the control unit 260 changes a resistance value of the reference resistance unit 245, compares the changed resistance value with the cell resistance value, and determines a range to which the cell resistance value belongs to determine the data programmed to the antifuse memory cell MC. As a result, the control unit 260 determines the data programmed to the antifuse memory cell MC and returns a value of the detected data.

Figure 3:
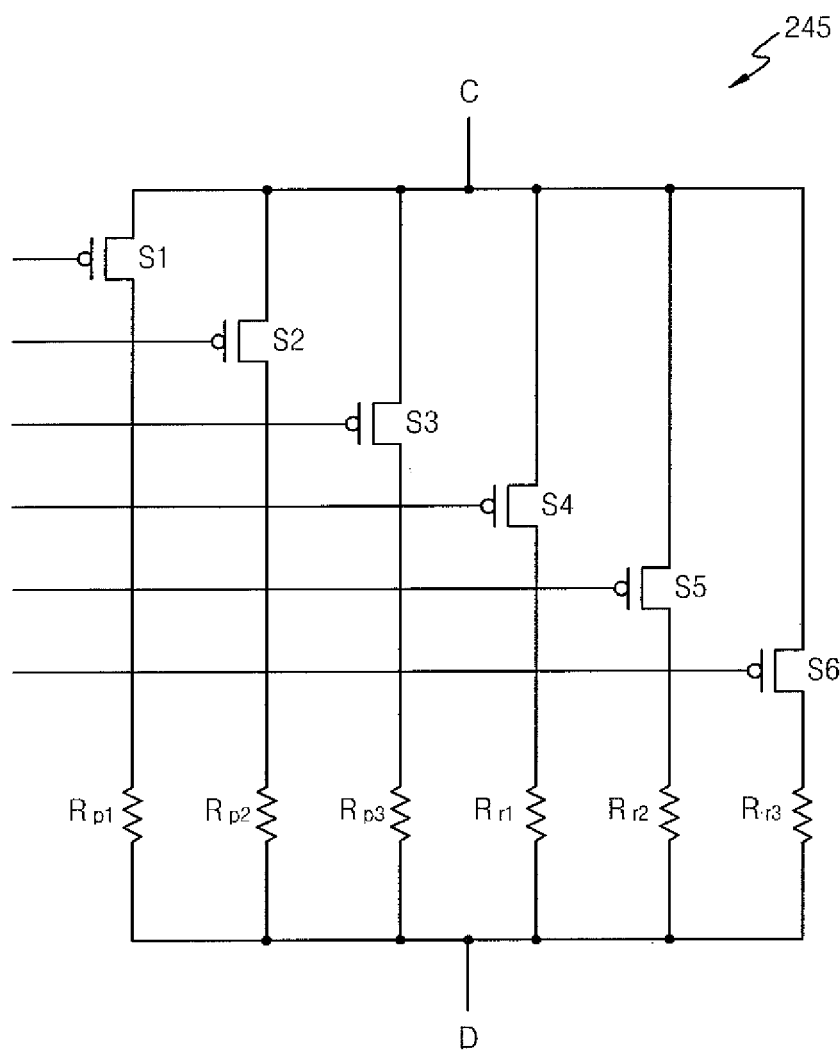
FIG. 3 is a circuit diagram illustrating a reference resistance unit of an antifuse memory device, according to an exemplary embodiment of the inventive concept.

FIG. 3 is a circuit diagram illustrating the reference resistance unit 245 of an antifuse memory device, according to an exemplary embodiment of the inventive concept.

Referring to FIG. 3, the reference resistance unit 245 includes a plurality of resistors Rp1, Rp2, Rp3, Rr1, Rr2, and Rr3 that are connected in parallel to each other. In FIG. 3, the reference resistance unit 245 includes the three program resistors Rp1, Rp2, and Rp3 and the three read resistors Rr1, Rr2, and Rr3 since 2-bit data may be programmed to the antifuse memory cell MC. If n-bit data is to be programmed to the antifuse memory cell MC, the reference resistance unit 245 includes a $2^n-1$ number of program resistors and a $2^n-1$ number of read resistors.

The reference resistance unit 245 includes switches S1-S6 that are connected in series to the plurality of resistors Rp1, Rp2, Rp3, Rr1, Rr2, and Rr3. The resistance of the reference resistance unit 245 is determined according to the resistors selected among the plurality of resistors Rp1, Rp2, Rp3, Rr1, Rr2, and Rr3 by the switches S1-S6. As shown in FIG. 3, the switches S1-S6 may be implemented as a PMOS transistor, and may be controlled by the control unit 260. In an exemplary embodiment, the control unit 260 selects and short-circuits one of the switches S1-S6 and thus the resistance of the reference resistance unit 245 is the resistance of one of the corresponding resistors Rp1, Rp2, Rp3, Rr1, Rr2, and Rr3.

In an embodiment where the switches S1-S6 are implemented as the PMOS transistor, a source-drain voltage drop may occur between the switches S1-S6 due to an electrical characteristic of the PMOS transistor. To remove such a voltage drop, the replica switching transistor RSTr are removed, and thus the switches S1-S6 may have the same electrical characteristic as the switching transistor STr. In this case, the switches S1-S6 that are turned on may generate the same source-drain resistance and source-drain voltage drop as generated by the switching transistor STr. Thus, a cell resistance and the cell current Icell of the antifuse AF may be more precisely controlled.

The circuit diagram of the reference resistance unit 245 of FIG. 3 is an example, as the inventive concept is not limited thereto. For example, the reference resistance unit 245 may be represented as a combination resistor of the resistors Rp1, Rp2, Rp3, Rr1, Rr2, and Rr3 when two or more switches S1-S6 are short-circuited.

Assuming that 2-bit data is to be programmed to the antifuse memory cell MC, and the antifuse memory cell MC that is not destroyed at an initial stage indicates "00", the first program resistor Rp1 may correspond to data "01", the second program resistor Rp2 may correspond to data "11", and the third program resistor Rp3 may correspond to data "10". In this case, the first program resistor Rp1 has a resistance value greater than that of the second program resistor Rp2, and the second program resistor Rp2 has a resistance value greater than that of the third program resistor Rp3. For example, the first program resistance Rp1 may be 80 kΩ, the second program resistor Rp2 may be 40 kΩ, and the third program resistor Rp3 may be 20 kΩ. However, the inventive concept is not limited thereto, as the program resistors may have various resistances.

Figure 4:
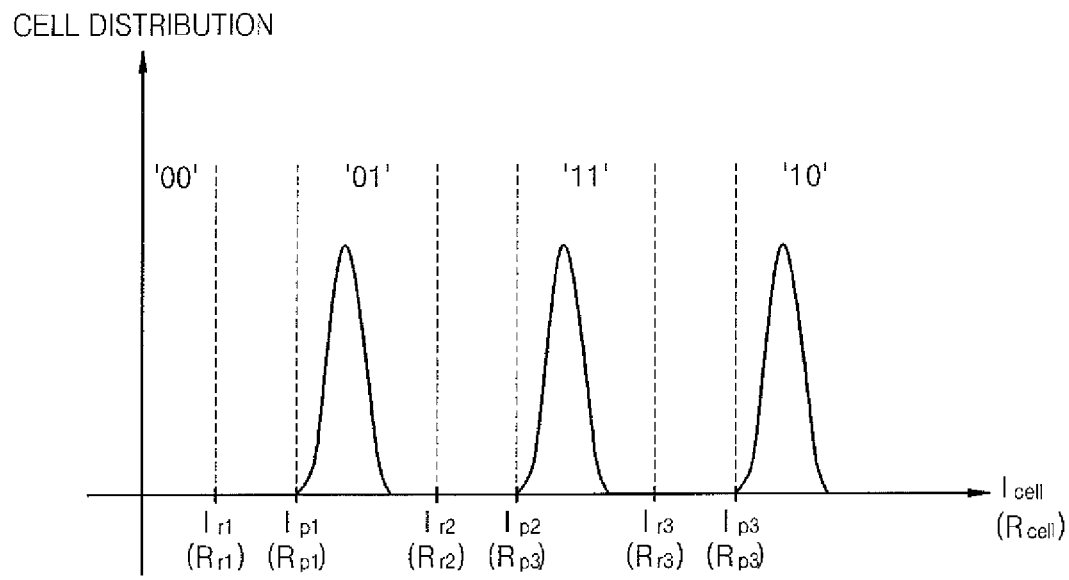
FIG. 4 is a graph illustrating cell distribution in an embodiment where the reference resistance unit of FIG. 3 is used to program data to an antifuse memory cell.

FIG. 4 is a graph illustrating cell distribution in an embodiment where the reference resistance unit 245 of FIG. 3 is used to program data to the antifuse memory cell MC.

FIG. 4 shows a distribution of the cell current Icell of the programmed antifuse memory cell MC. As described above, assuming that 2-bit data is to be programmed to the antifuse memory cell MC, and the antifuse memory cell MC that is not destroyed at an initial stage indicates "00", the antifuse memory cell MC in which "00" is programmed has the cell current Icell of 0. The antifuse memory cell MC in which "01" is programmed has a resistance value smaller than that of the first program resistor Rp1. As a result, the cell current Icell of the antifuse memory cell MC in which "01" is programmed is higher than a reference current when the reference resistance unit 245 is the first program resistor Rp1, i.e. a first program reference current Ip1. Likewise, the antifuse memory cell MC in which "11" is programmed has a resistance value smaller than that of the second program resistor Rp2. As a result, the cell current Icell of the antifuse memory cell MC in which "11" is programmed is higher than a reference current when the reference resistance unit 245 is the second program resistor Rp2, i.e., a second program reference current Ip2. The antifuse memory cell Mc in which "10" is programmed has a resistance value smaller than that of the third program resistor Rp3. As a result, the cell current Icell of the antifuse memory cell MC in which "10" is programmed is higher than a reference current when the reference resistance unit 245 is the third program resistor Rp3, i.e., a third program reference current Ip3.

Referring back to FIG. 3, the reference resistance unit 245 may include the first through third read resistors Rr1, Rr2, and Rr3 to detect values of bits of data programmed to the antifuse memory cell MC. As shown in FIG. 4, to have a sensing margin, the first through third read resistors Rr1, Rr2, and Rr3 are respectively greater than the first through third program resistors Rp1, Rp2, and Rp3. For example, the first read resistance Rr1 is 160 kΩ, the second read resistor Rr2 is 53 kΩ, and the third read resistor Rr3 is 27 kΩ. However, the inventive concept is not limited thereto, as the read resistors may have various resistances. As described above, the control unit 260 receives feedback through the comparison unit 250, and thus a cell resistance value may be secured to be smaller than a reference resistance value. Thus, to detect the values of bits of data programmed to the antifuse memory cell MC, the first through third read resistors Rr1, Rr2, and Rr3 are not used and instead the first through third program resistors Rp1, Rp2, and Rp3 are used.

The control unit 260 controls the reference resistance unit 245 to have a resistance value of the first read resistor Rr1 to detect the values of bits of data programmed to the antifuse memory cell MC. Thereafter, the cell current Icell is compared to the first read reference current Ir1. If the cell current Icell is smaller than the first read reference current Ir1, since the data stored in the antifuse memory cell MC is determined as "00", the control unit 260 stops a read operation and outputs the data "00". However, if the cell current Icell is greater than the first read reference current Ir1, the control unit 260 may control the reference resistance unit 245 to have a resistance value of the second read resistor Rr2.

The comparison unit 250 compares the cell current Icell with a second read current Ir2. If the cell current Icell is smaller than the second read current Ir2, since the data stored in the antifuse memory cell MC is determined as "01", the control unit 260 stops a read operation and outputs the data "01". However, if the cell current Icell is greater than the second read current Ir2, the control unit 260 controls the reference resistance unit 245 to have a resistance value of the third read resistor Rr3.

The comparison unit 250 compares the cell current Icell with a third read current Ir3. If the cell current Icell is smaller than the third read current Ir3, since the data stored in the antifuse memory cell MC is determined as "11", the control unit 260 stops a read operation and outputs the data "11". However, if the cell current Icell is greater than the third read current Ir3, since the data stored in the antifuse memory cell MC is determined as "10", the control unit 260 outputs the data "10".

It is assumed that the cell current Icell increases in the order of "00", "01", "11", and "10" in FIG. 4, but the inventive concept is not limited thereto. Another order, for example, an order of "11", "10", "01", and "00", may be applied.

However, the order of "00", "01", "11", and "10" may be useful in obtaining a value of one of the bits of the data programmed to the antifuse memory cell MC. For example, to obtain an upper bit (i.e. a left bit) among the bits of the data programmed to the antifuse memory cell MC, the cell current Icell is compared to the second read current Ir2. If the cell current Icell is smaller than the second read current Ir2, a value of the upper bit among the bits of the data programmed to the antifuse memory cell MC is "0", and, if the cell current Icell is greater than the second read current Ir2, the value of the upper bit among the bits of the data programmed to the antifuse memory cell MC is "1".

Also, to obtain a lower bit (i.e. a right bit) among the bits of the data programmed to the antifuse memory cell MC, the cell current Icell is compared to the first read current Ir1 or the third read current Ir3. If the cell current Icell is smaller than the first read current Ir1 or is greater than the third read current Ir3, a value of the lower bit among the bits of the data programmed to the antifuse memory cell MC is "0", and, if the cell current Icell is greater than the first read current Ir1 or is smaller than the third read current Ir3, the value of the lower bit among the bits of the data programmed to the antifuse memory cell MC is "1". Thus, in an embodiment where the cell current Icell is defined as increasing in the order of "00", "01", "11", and "10", a comparison number may be reduced, and thus the order of "00", "01", "11", and "10" may be further useful for knowing a value of one of the bits of the data programmed to the antifuse memory cell MC.

Figure 5:
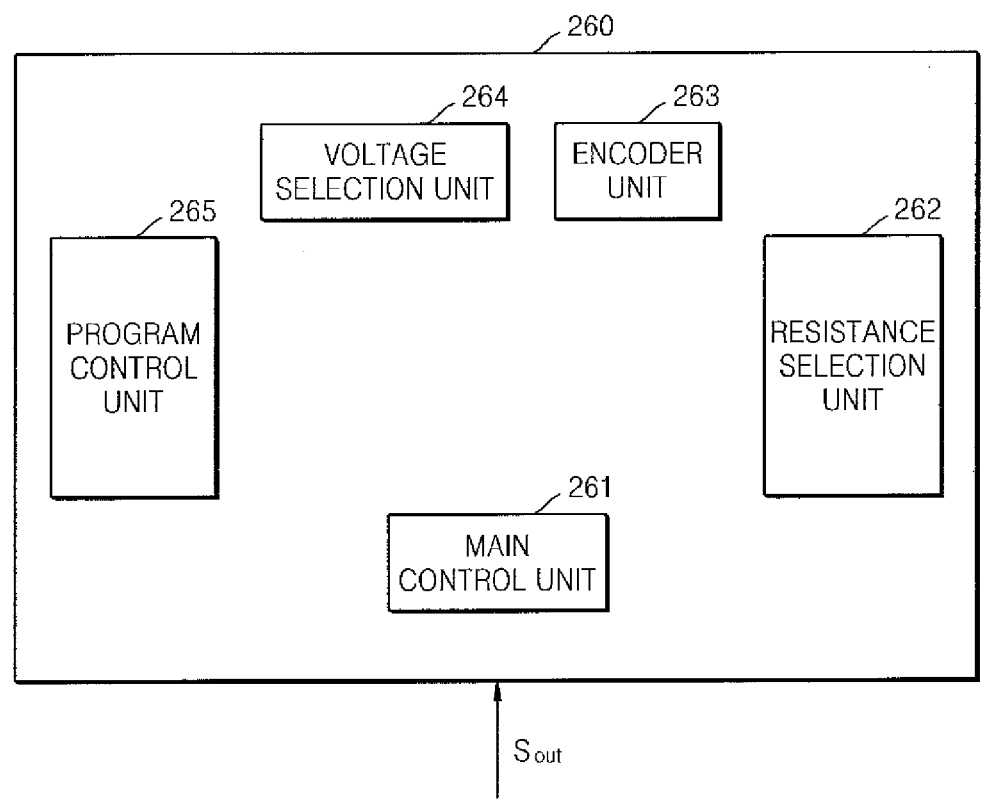
FIG. 5 is a block diagram illustrating a control unit of FIG. 2.

FIG. 5 is a block diagram illustrating an exemplary embodiment of the control unit 260 of FIG. 2.

Referring to FIG. 5, the control unit 260 includes at least one of a main control unit 261, a resistance selection unit 262, an encoder unit 263, a voltage selection unit 264, and a program control unit 265. The control unit 260 may receive the output signal Sout corresponding to a comparison result obtained from the comparison unit 250.

The main control unit 261 controls operations of the resistance selection unit 262, the encoder unit 263, the voltage selection unit 264, and the program control unit 265 according to an operating mode. The resistance selection unit 262 controls the reference resistance unit 245 according to the control of the main control unit 261. The resistance selection unit 262 may control the reference resistance unit 245 to have one of resistance values of the first through third program resistors Rp1, Rp2, and Rp3 and the first through third read resistors Rr1, Rr2, and Rr3. The resistance selection unit 262 may be referred to as a reference current selection unit in that a resistance value of the reference resistance unit 245 is selected, and accordingly a reference current intensity is selected.

The encoder unit 263 may encode and output data programmed to the antifuse memory cell MC according to the control of the main control unit 261. The voltage selection unit 264 controls an output voltage of the voltage generation unit 210 according to the operating mode. In a program operating mode, the voltage selection unit 264 controls the voltage generation unit 210 to output the destruction voltage Vrup. In a read operating mode, the voltage selection unit 264 controls the voltage generation unit 210 to output the read voltage Vsense. The program control unit 265 may control the switching transistor STr to be turned off in response to the output signal Sout indicating that the cell current ICell is greater than the reference current Iref in the program operating mode.

Figure 6:
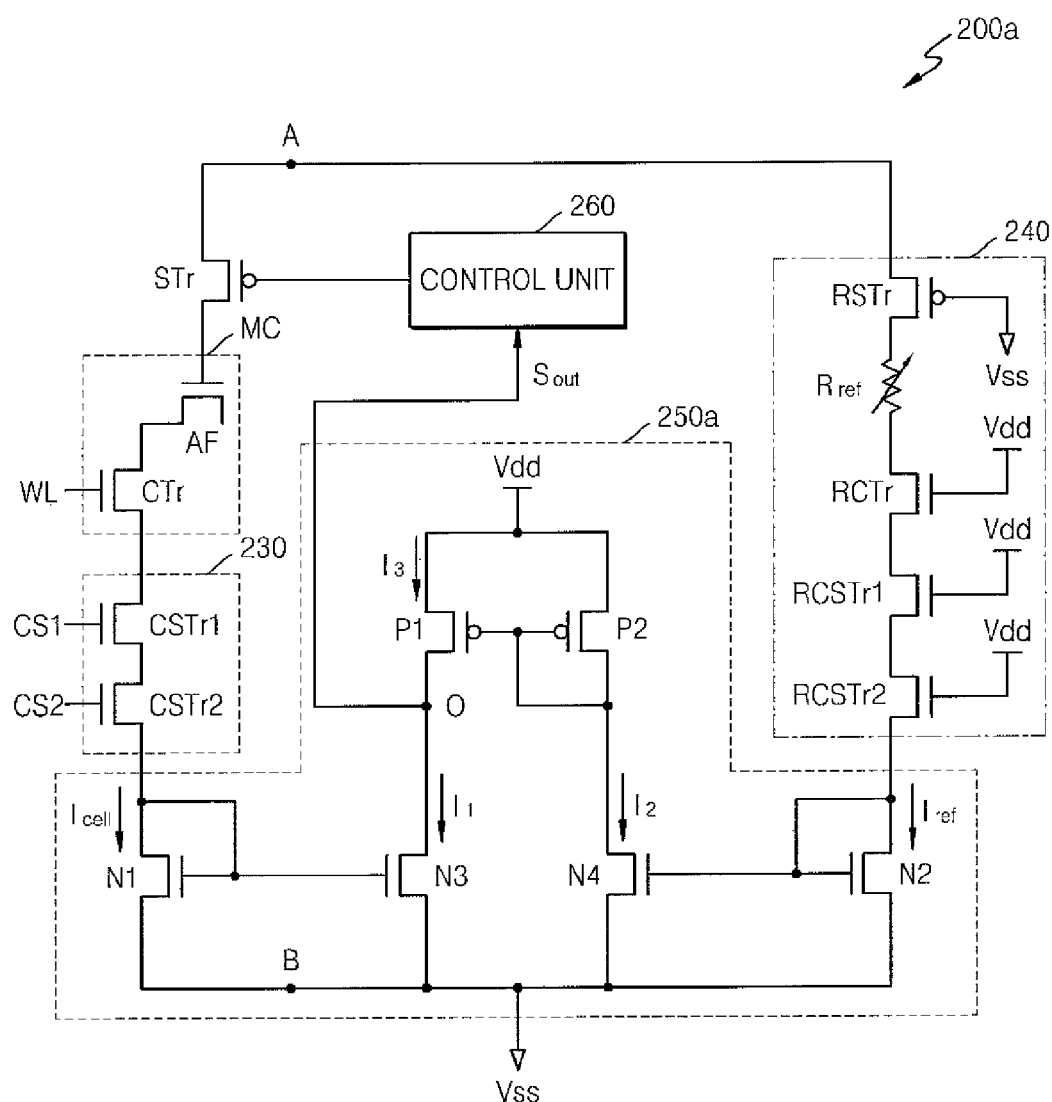
FIG. 6 illustrates an antifuse memory device according to an exemplary embodiment of the inventive concept.

FIG. 6 illustrates an antifuse memory device 200a according to an exemplary embodiment of the inventive concept.

Referring to FIG. 6, elements of the antifuse memory device 200a are substantially the same as those of the antifuse memory device 200 of FIG. 2, except the comparison unit 250 is replaced with comparison unit 250a. Thus, redundant descriptions are not repeated here, and the comparison unit 250a will now be described in detail.

The comparison unit 250a includes first through fourth NMOS transistors N1-N4 and first and second PMOS transistors P1 and P2. The first NMOS transistor N1 is connected between the second address selection transistor CSTr2 and the second node B. The first NMOS transistor N1 has a diode connection in which a drain and a gate are commonly connected.

Corresponding to the first NMOS transistor N1, the second NMOS transistor N2 is connected between the second replica selection transistor RCSTr2 and the second node B. The first NMOS transistor N1 and the second NMOS transistor N2 may have the same electrical characteristic. For example, the first NMOS transistor N1 and the second NMOS transistor N2 may have at least one of the same transconductance, aspect ratio, threshold voltage, and processing parameters. The second NMOS transistor N2 also has the diode connection in which a drain and a gate are commonly connected.

The comparison unit 250a includes the first PMOS transistor P1 and the third NMOS transistor N3 connected in series between the power voltage Vdd and the ground voltage Vss. Also, the comparison unit 250a includes the second PMOS transistor P2 and the fourth NMOS transistor N4 connected in series between the power voltage Vdd and the ground voltage Vss. A node O between the first PMOS transistor P1 and the third NMOS transistor N3 may be referred to as an output node, and may be used to output the output signal S out.

The first NMOS transistor N1 acts as a current mirror with respect to the third NMOS transistor N3. Thus, a first current I1 that is directly proportional to the cell current Icell may flow through the fourth NMOS transistor N4. The fourth NMOS transistor N4 and the second NMOS transistor N2 may have the same aspect ratio. In this case, the reference current Iref and a second current I2 have the same intensity. The fourth NMOS transistor N4 and the second PMOS transistor P2 are connected in series to each other, and thus the second current I2 that is directly proportional to the reference current Iref may flow through the second PMOS transistor P2. The second PMOS transistor P2 has the diode connection, and acts as a current mirror with respect to the first PMOS transistor P1. Thus, a third current I3 that is directly proportional to the reference current Iref may flow through the first PMOS transistor P1. The first PMOS transistor P1 and the second PMOS transistor P2 may have the same aspect ratio. In this case, the second current I2 and the third current I3 have the same intensity.

If it is assumed that a ratio of the cell current Icell and the first current I1 is the same as a ratio of the reference current Iref and the third current I3, in an embodiment where the reference current Iref is higher than the cell current Icell, the output node O outputs a power voltage level, i.e. a high level output signal. To the contrary, in an embodiment where the cell current Icell is higher than the reference current Iref, the output node O outputs a ground voltage level, i.e. a low level output signal. Thus, no current flows in the antifuse AF in the program operating mode since both terminals of the antifuse AF are initially open due to a dielectric. That is, the cell current Icell is smaller than the reference current Iref, and thus the output signal Sout of a high level is output. Thereafter, as the dielectric of the antifuse AF is destroyed by the destruction voltage Vrup, both terminals of the antifuse AF are short-circuited, and thus the cell current Icell increases. When the cell current Icell is higher than the reference current Iref, the output signal Sout transitions to a low level.

In an exemplary embodiment, the control unit 260 turns the switching transistor STr off in response to the output signal Sout transitioned to the low level such that the destruction voltage Vrup is no longer applied to one terminal of the antifuse AF. Also, the control unit 260 may perform a read operation to determine whether desired data is programmed to the antifuse AF.

Figure 7:
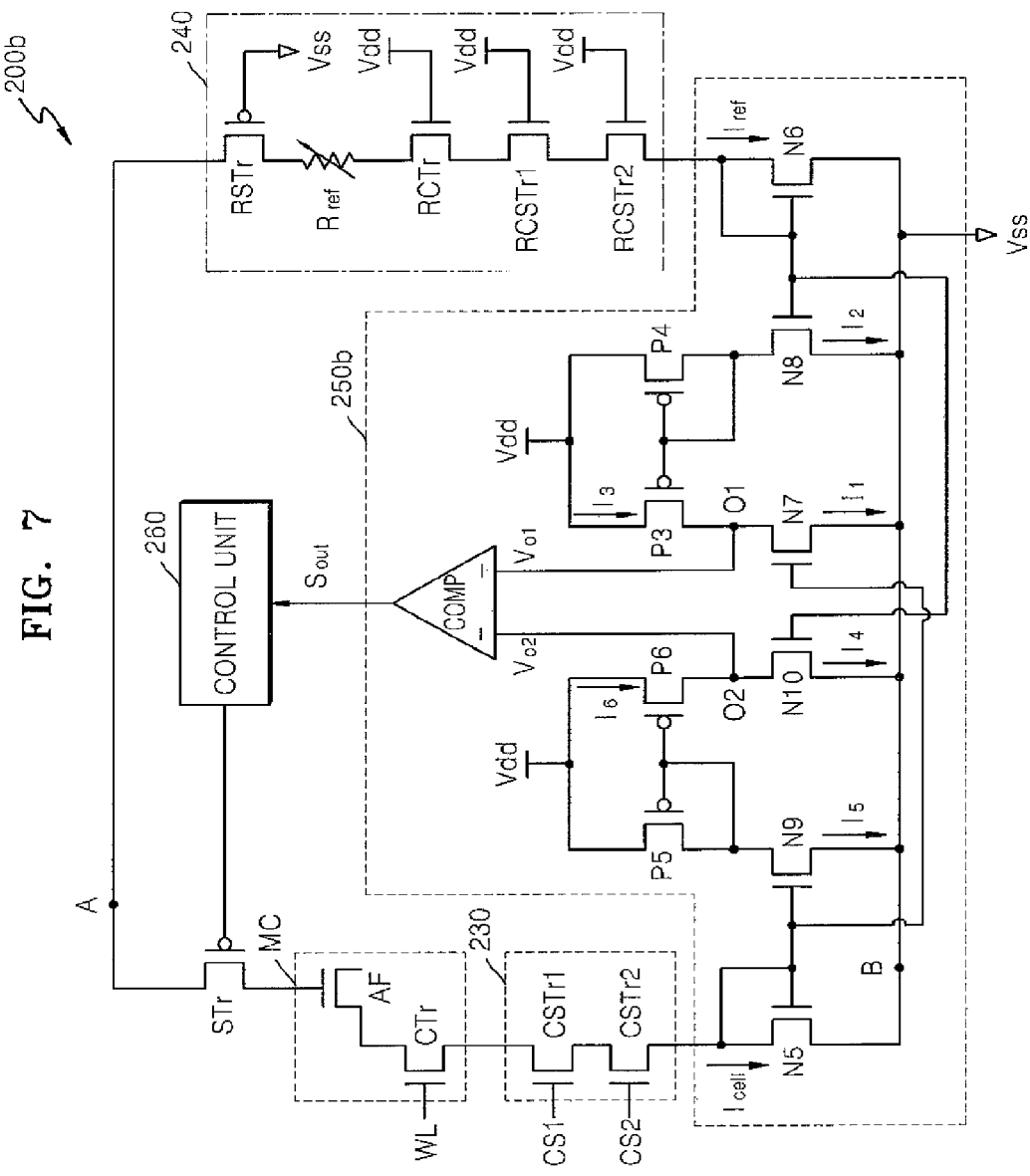
FIG. 7 illustrates an antifuse memory device according to an exemplary embodiment of the inventive concept.

FIG. 7 illustrates an antifuse memory device 200b according to an exemplary embodiment of the inventive concept.

Referring to FIG. 7, elements of the antifuse memory device 200b are substantially the same as those of the antifuse memory device 200 of FIG. 2 except for the comparison unit 250 is replaced with comparison unit 250b. Thus, redundant descriptions are not repeated here, and the comparison unit 250b will now be described in detail.

The comparison unit 250b includes fifth through tenth NMOS transistors N5-N10 and third through sixth PMOS transistors P3-P6. The fifth NMOS transistor N5 is connected between the second address selection transistor CSTr2 and the second node B. The fifth NMOS transistor N5 has a diode connection in which a drain and a gate are commonly connected.

Corresponding to the fifth NMOS transistor N5, the sixth NMOS transistor N6 is connected between the second replica selection transistor RCSTr2 and the second node B. The fifth NMOS transistor N5 and the sixth NMOS transistor N6 may have the same electrical characteristic. The sixth NMOS transistor N6 has the diode connection in which a drain and a gate are commonly connected.

The comparison unit 250b includes the third PMOS transistor P3 and the seventh NMOS transistor N7 connected in series between the power voltage Vdd and the ground voltage Vss. Also, the comparison unit 250b includes the fourth PMOS transistor P4 and the eighth NMOS transistor N8 connected in series between the power voltage Vdd and the ground voltage Vss. A node O1 between the third PMOS transistor P3 and the seventh NMOS transistor N7 may be referred to as a first output node, which is connected to a positive + terminal of a comparator COMP.

The comparison unit 250b includes the fifth PMOS transistor P5 and the ninth NMOS transistor N9 connected in series between the power voltage Vdd and the ground voltage Vss. Also, the comparison unit 250b includes the sixth PMOS transistor P6 and the tenth NMOS transistor N10 connected in series between the power voltage Vdd and the ground voltage Vss. A node O2 between the sixth PMOS transistor P6 and the tenth NMOS transistor N10 may be referred to as a second output node, which is connected to a negative − terminal of the comparator COMP.

The fifth NMOS transistor N5 acts as a current mirror with respect to the seventh NMOS transistor N7. Thus, the first current I1 that is directly proportional to the cell current Icell may flow through the seventh NMOS transistor N7. The sixth NMOS transistor N6 also acts as a current mirror with respect to the eighth NMOS transistor N8. Thus, the second current I2 that is directly proportional to the reference current Iref may flow through the eighth NMOS transistor N8. The eighth NMOS transistor N8 and the fourth PMOS transistor P4 are connected in series to each other, and thus the second current I2 that is directly proportional to the reference current Iref may flow through the fourth PMOS transistor P4. The fourth PMOS transistor P4 has the diode connection, and acts as a current mirror with respect to the third PMOS transistor P3. Thus, the third current I3 that is directly proportional to the reference current Iref may flow through the third PMOS transistor P3.

If it is assumed that a ratio of the cell current Icell and the first current I1 is the same as a ratio of the reference current Iref and the third current I3, in an embodiment where the reference current Iref is higher than the cell current Icell, the first output node O1 may have a voltage level approximate to the power voltage Vdd. To the contrary, in an embodiment where the cell current Icell is higher than the reference current Iref, the first output node O1 may have a voltage level approximate to the ground voltage Vss.

The sixth NMOS transistor N6 acts as a current mirror with respect to the tenth NMOS transistor N10. Thus, a fourth current I4 that is directly proportional to the reference current Iref may flow through the tenth NMOS transistor N10. The fifth NMOS transistor N5 acts as a current mirror with respect to the ninth NMOS transistor N9. Thus, a fifth current I5 that is directly proportional to the cell current Icell may flow through the ninth NMOS transistor N9. The ninth NMOS transistor N9 and the fifth PMOS transistor P5 are connected in series to each other, and thus the fifth current I5 that is directly proportional to the cell current Icell may flow through the fifth PMOS transistor P5. The fifth PMOS transistor P5 has the diode connection, and acts as a current mirror with respect to the sixth PMOS transistor P6. Thus, a sixth current I6 that is directly proportional to the cell current Icell may flow through the sixth PMOS transistor P6.

If it is assumed that a ratio of the cell current Icell and the sixth current I6 is the same as a ratio of the reference current Iref and the fourth current I4, in an embodiment where the reference current Iref is higher than the cell current Icell, the second output node O2 has the voltage level approximate to the ground voltage Vss. To the contrary, in an embodiment where the cell current Icell is higher than the reference current Iref, the second output node O2 may have the voltage level approximate to the power voltage Vdd.

In an exemplary embodiment, the comparator COMP outputs the output signal Sout of a high level if a voltage of the first output node O1 is higher than a voltage of the second output node O2, and outputs the output signal Sout of a low level if the voltage of the first output node O1 is lower than the voltage of the second output node O2. Thus, if the reference current Iref is higher than the cell current Icell, the output signal Sout of the high level is output, and, if the reference current Iref is lower than the cell current Icell, the output signal Sout of the low level is output.

Therefore, no current flows in the antifuse AF in the program operating mode since both terminals of the antifuse AF are initially open due to the presence of a non-destroyed dielectric. That is, the cell current Icell is smaller than the reference current Iref, and thus the output signal Sout of the high level is output. Thereafter, as the dielectric of the antifuse AF is destroyed by the destruction voltage Vrup, both terminals of the antifuse AF are short-circuited, and thus the cell current Icell increases. When the cell current Icell is higher than the reference current Iref, the output signal Sout transitions to the low level.

As described above, the control unit 260 may turn the switching transistor STr off in response to the output signal Sout transitioned to the low level such that the destruction voltage Vrup is no longer applied to one terminal of the antifuse AF. Also, the control unit 260 may perform a read operation to determine whether desired data is programmed to the antifuse AF.

Figure 8:
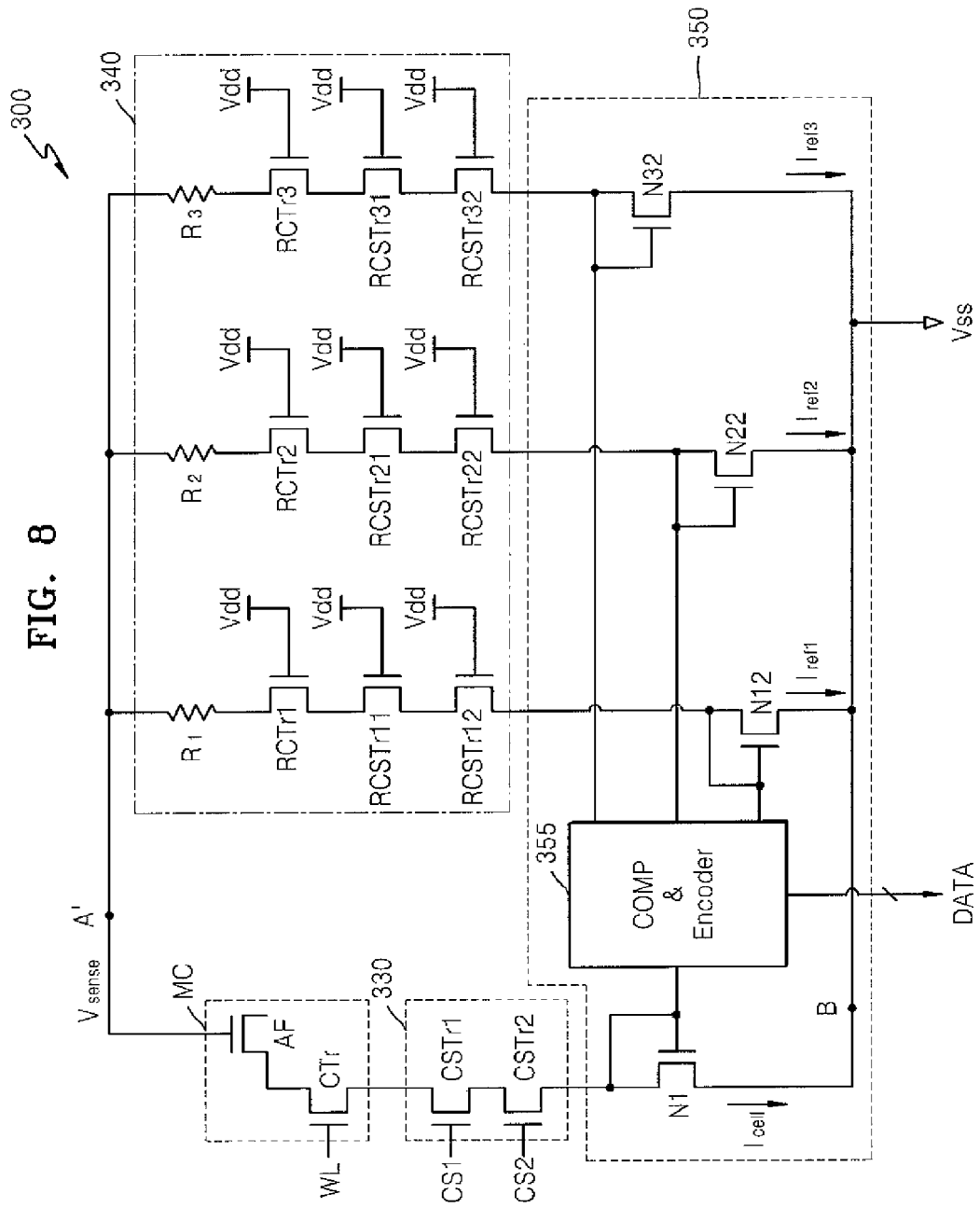
FIG. 8 is a schematic block diagram illustrating an antifuse memory device according to an exemplary embodiment of the inventive concept.

FIG. 8 is a schematic block diagram illustrating an antifuse memory device 300 according to an exemplary embodiment of the inventive concept.

Referring to FIG. 8, the antifuse memory device 300 includes the antifuse memory cell MC, a column decoder 330, a reference current generation unit 340, and a comparison unit 350. The antifuse memory device 300 has a construction that allows a read operation to be performed. Thus, elements for a program operation are not shown in FIG. 8. Also, the antifuse memory device 300 includes the antifuse memory cell MC and the column decoder 330, like the antifuse memory device 200 of FIG. 2. Thus, redundant descriptions thereof are not repeated here. The read voltage Vsense may be applied to a first node A'.

The reference current generation unit 340 generates first through third read reference currents Iref1, Iref2, and Iref3. Although the reference current generation unit 340 includes the three read reference currents in FIG. 8, if data of more bits is to be programmed to the antifuse memory cell MC, the reference current generation unit 340 may include a greater number of read reference currents. For example, if 3-bit data is programmed to the antifuse memory cell MC, the reference current generation unit 340 may generate seven read reference currents.

The first read reference current Iref1 may be generated through a first path between the first node A' and the second node B. The first path may include a first read resistor R1, a first replica cell transistor RCTr1, and first replica selection transistors RCSTr11 and RCSTr12. An intensity of the first read reference current Iref1 may be determined according to a resistance of the first read resistor R1. The first read resistor R1 may have the same resistance value as the first read resistor Rr1 of FIG. 3.

The second read reference current Iref2 is generated through a second path between the first node A' and the second node B. The second path may include a second read resistor R2, a second replica cell transistor RCTr2, and second replica selection transistors RCSTr21 and RCSTr22. An intensity of the second read reference current Iref2 may be determined according to a resistance of the second read resistor R2. The second read resistor R2 may have the same resistance value as the second read resistor Rr2 of FIG. 3.

The third read reference current Iref3 is generated through a third path between the first node A' and the second node B. The third path may include a third read resistor R3, a third replica cell transistor RCTr3, and third replica selection transistors RCSTr31 and RCSTr32. An intensity of the third read reference current Iref3 may be determined according to a resistance of the third read resistor R3. The third read resistor R3 may have the same resistance value as the third read resistor Rr3 of FIG. 3.

The first through third replica cell transistors RCTr1, RCTr2, and RCTr3 may have the same electrical characteristics as the cell transistor CTR. Also, the first through third replica selection transistors RCSTr11, RCSTr12, RCSTr21, RCSTr22, RCSTr31, and RCSTr32 may have the same electrical characteristics as the address selection transistors CSTr1 and CSTr2, respectively.

The comparison unit 350 includes transistors N1, N12, N22, and N32 for current mirroring and a comparison and encoder unit 355.

The transistor N1 has the same connection relationship as the first NMOS transistor N1 and the fifth NMOS transistor N5 of FIGS. 6 and 7. The transistor N1 has a diode connection, and constitutes a current mirror with respect to a transistor (not shown) of a block indicated as the comparison and encoder unit 355. Thus, current that is proportional to the cell current Icell may be provided to the comparison and encoder unit 355.

The transistor N12 has the same connection relationship as the second NMOS transistor N2 and the sixth NMOS transistor N6 of FIGS. 6 and 7. The transistor N12 has the diode connection, and constitutes a current mirror with respect to the transistor (not shown) of the block indicated as the comparison and encoder unit 355. Thus, current that is proportional to the first read reference current Iref1 may be provided to the comparison and encoder unit 355. Likewise, the transistor N22 has the diode connection, and constitutes a current mirror with respect to the transistor (not shown) of the block indicated as the comparison and encoder unit 355. Thus, current that is proportional to the second read reference current Iref2 may be provided to the comparison and encoder unit 355. Also, the transistor N32 has the diode connection, and constitutes a current mirror with respect to the transistor (not shown) of the block indicated as the comparison and encoder unit 355. Thus, current that is proportional to the third read reference current Iref1 may be provided to the comparison and encoder unit 355.

The comparison and encoder unit 355 compare the cell current Icell with the first through third reference currents Iref1, Iref2, and Iref3. Also, the comparison and encoder unit 355 output data stored in the antifuse memory cell MC based on a comparison result. For example, assuming that the cell current Icell has the cell distribution of FIG. 4, the comparison and encoder unit 355 may output data "00" when determining that the cell current Icell is lower than the first read reference current Iref1. Also, the comparison and encoder unit 355 may output data "01" when determining that the cell current Icell is higher than the first read reference current Iref1 but is lower than the second read reference current Iref2. Also, the comparison and encoder unit 355 may output data "11" when determining that the cell current Icell is higher than the second read reference current Iref2 but is lower than the third read reference current Iref3. Also, the comparison and encoder unit 355 may output data "10" when determining that the cell current Icell is higher than the third read reference current Iref3.

The antifuse memory device 300 generates a plurality of reference currents and thus compares the cell current Icell with the first through third reference currents Iref1, Iref2, and Iref3 simultaneously or at substantially the same time, thereby detecting and outputting data more quickly.

Figure 9:
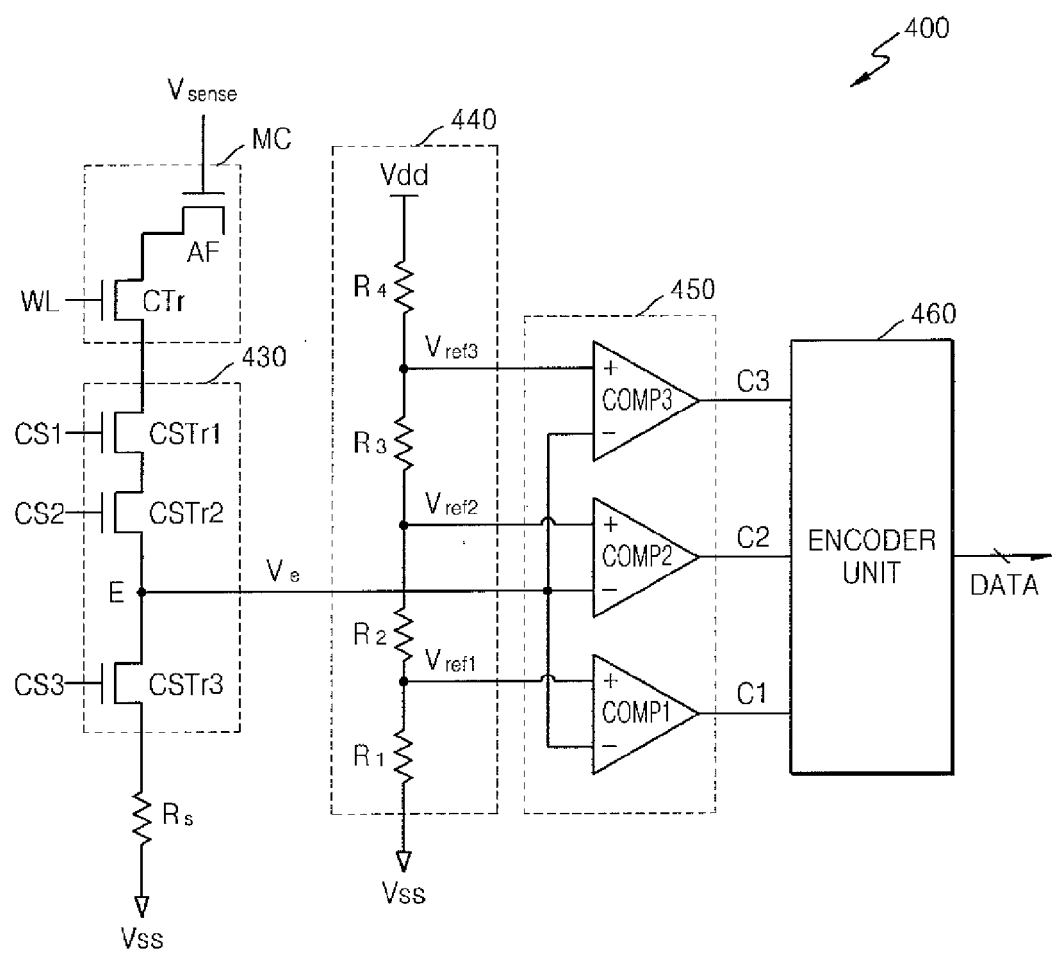
FIG. 9 is a schematic block diagram illustrating an antifuse memory device according to an exemplary embodiment of the inventive concept.

FIG. 9 is a schematic block diagram illustrating an antifuse memory device 400 according to an exemplary embodiment of the inventive concept.

Referring to FIG. 9, the antifuse memory device 400 includes the antifuse memory cell MC, a column decoder 430, a reference voltage generation unit 440, a comparison unit 450, and an encoder unit 460. The antifuse memory device 400 has a construction that allows it to perform a read operation. Thus, elements for a program operation are not shown in FIG. 9.

The antifuse memory cell MC includes the antifuse AF that may be implemented as a MOS transistor, and the cell transistor CTr connected to the antifuse AF and controlled by a word line signal. The read voltage Vsense may be applied to the antifuse AF in a read operating mode.

The column decoder 430 is connected to the antifuse memory cell MC. Although the column decoder 430 includes the three address selection transistors CSTr1-CSTr3 in FIG. 9, this is merely one exemplary embodiment. For example, the column decoder 430 may include a lesser or greater number of address selection transistors. While, a comparison node E is disposed between the second address selection transistor CSTr2 and the third address selection transistor CSTr3 in FIG. 9, the inventive concept is not limited thereto. For example, the comparison node E may be disposed between the first address selection transistor CSTr1 and the second address selection transistor CSTr2, and between the third address selection transistor CSTr3 and a source resistor Rs. The column decoder 430 may be connected to a ground voltage source Vss through the source resistor Rs.

A voltage level Ve of the comparison node E may differ according to a resistance value of the antifuse memory cell MC. For example, assuming that the cell transistor CTr and the address selection transistors CSTr1-CSTr3 have a small source-drain resistance and a low source-drain voltage, if the antifuse memory cell MC is not programmed or "00" is programmed thereto, the comparison node E may have the voltage level Ve of a ground voltage level. If a resistance of the antifuse memory cell MC is R01 since "01" is programmed to the antifuse memory cell MC, the comparison node E has the voltage level Ve of approximately {Rs/(R01+Rs)}Vsense. If the resistance of the antifuse memory cell MC is R11, since "11" is programmed to the antifuse memory cell MC, the comparison node E has the voltage level Ve of approximately {Rs/(R11+Rs)}Vsense. If the resistance of the antifuse memory cell MC is R10, since "10" is programmed to the antifuse memory cell MC, the comparison node E has the voltage level Ve of approximately {Rs/(R10+Rs)}Vsense.

If the cell distribution of the antifuse memory cell Mc is the same as shown in FIG. 4, the resistance of the antifuse memory cell MC is reduced in the order of R01, R11, and R10. Thus, the voltage level Ve of the comparison node E may differ according to data programmed to the antifuse memory cell MC. More specifically, in an embodiment where "00" is programmed to the antifuse memory cell MC, the voltage level Ve (hereinafter referred to as a first voltage level Ve00) of the comparison node E may be the lowest, in an embodiment where "01" is programmed to the antifuse memory cell MC, the voltage level Ve (hereinafter referred to as a second voltage level Ve01) of the comparison node E may be the second lowest, the voltage level Ve (hereinafter referred to as a third voltage level Ve11) of the comparison node E may be the third lowest, and the voltage level Ve (hereinafter referred to as a fourth voltage level Ve10) of the comparison node E may be the highest.

The reference voltage generation unit 440 may include a voltage distributer including first through fourth resistors R1, R2, R3, and R4 that are connected in series to each other between the power voltage Vdd and the ground voltage Vss. First through third reference voltages Vref1, Vref2, and Vref3 may be generated in nodes between the first through fourth resistors R1, R2, R3, and R4. The first reference voltage Vref1 may be set higher than the first voltage level Ve00 and lower than the second voltage level Ve01. The second reference voltage Vref2 may be set higher than the second voltage level Ve01 and lower than the third voltage level Ve11. The third reference voltage Vref3 may be set higher than the third voltage level Ve11 and lower than the fourth voltage level Ve10. The first through third reference voltages Vref1, Vref2, and Vref3 may be set having sufficient margins with respect to the first through fourth voltage levels Ve00, Ve01, Ve11, and Ve10.

The comparison unit 450 includes first through third comparators COMP1, COMP2, and COMP3 that respectively output first through third comparison results C1, C2, and C3. The first comparator COMP1 compares the first reference voltage Vref1 with the voltage level Ve of the comparison node E and outputs the first comparison result C1. In an embodiment where the first reference voltage Vref1 is higher than the voltage level Ve of the comparison node E, the first comparison result C1 has a high level voltage. To the contrary, in an embodiment where the first reference voltage Vref1 is lower than the voltage level Ve of the comparison node E, the first comparison result C1 has a low level voltage.

The second comparator COMP2 compares the second reference voltage Vref2 with the voltage level Ve of the comparison node E and outputs the second comparison result C2. In an embodiment where the second reference voltage Vref2 is higher than the voltage level Ve of the comparison node E, the second comparison result C2 has a high level voltage. To the contrary, in an embodiment where the second reference voltage Vref2 is lower than the voltage level Ve of the comparison node E, the second comparison result C2 has a low level voltage. Likewise, the third comparator COMP3 compares the third reference voltage Vref3 with the voltage level Ve of the comparison node E and outputs the third comparison result C3. In an embodiment where the third reference voltage Vref3 is higher than the voltage level Ve of the comparison node E, the third comparison result C3 has a high level voltage. To the contrary, in an embodiment where the third reference voltage Vref3 is lower than the voltage level Ve of the comparison node E, the third comparison result C3 has a low level voltage.

The encoder unit 460 receives the first through third comparison results C1, C2, and C3, and output the data programmed to the antifuse memory cell MC. For example, in an embodiment where the first through third comparison results C1, C2, and C3 are all low levels, the encoder unit 460 outputs data "00". In an embodiment where the first comparison result C1 is high level, and the second and third comparison results C2 and C3 are low levels, the encoder unit 460 outputs data "01". In an embodiment where the first and second comparison results C1 and C2 are high levels, and the third comparison result C3 is low level, the encoder unit 460 outputs data "11". In an embodiment where the first through third comparison results C1, C2, and C3 are all high levels, the encoder unit 460 outputs data "10".

Figure 10:
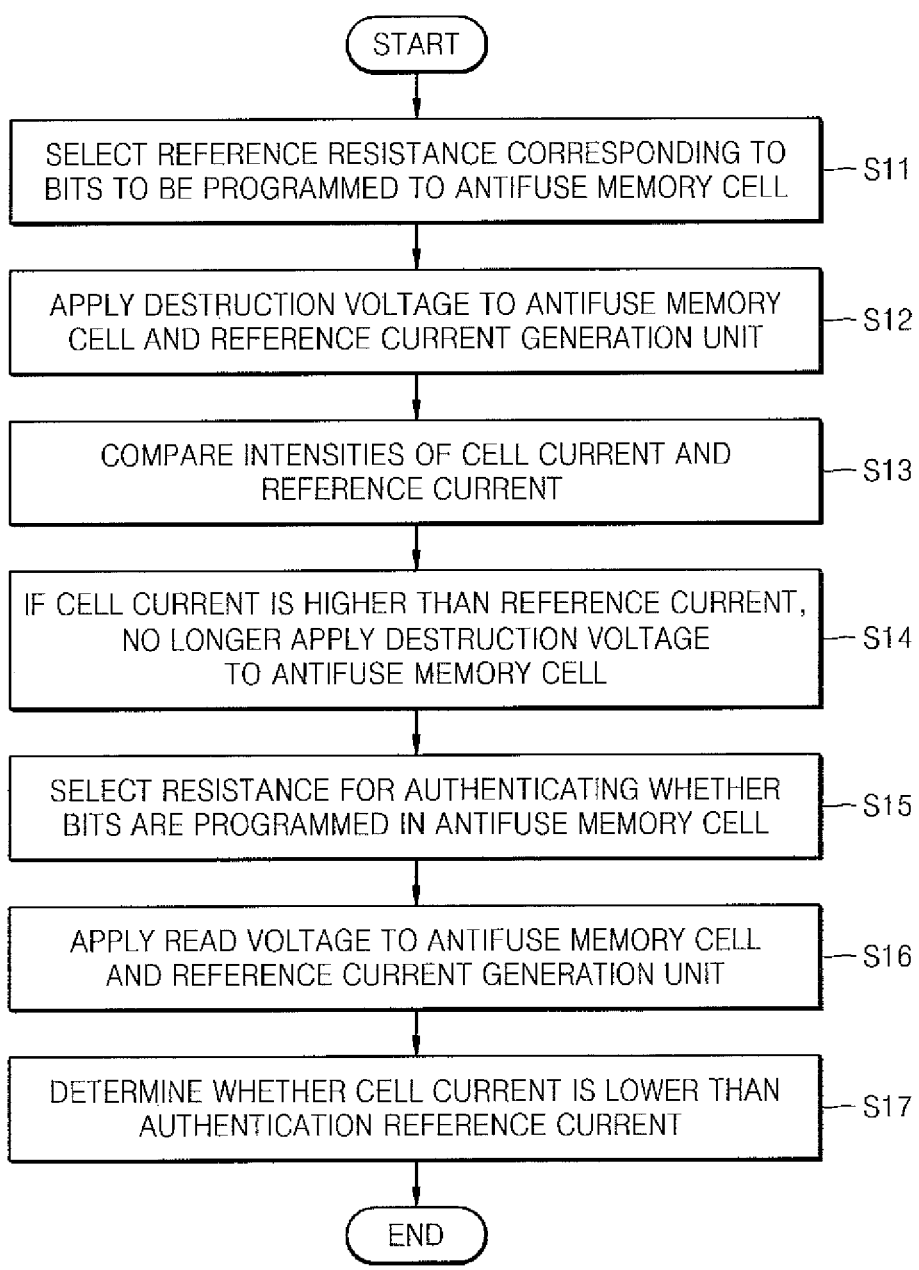
FIG. 10 is a flowchart of a program operation method performed by an antifuse memory device according to an exemplary embodiment of the inventive concept.

FIG. 10 is a flowchart of an operation method performed by an antifuse memory device according to an exemplary embodiment of the inventive concept. In particular, FIG. 10 is a flowchart of a program operation method performed by an antifuse memory device according to an exemplary embodiment of the inventive concept.

Referring to FIG. 10, in operation S11, a reference resistance corresponding to bits to be programmed to an antifuse memory cell is selected. In an embodiment where the antifuse memory cell has the cell distribution of FIG. 4, if bits "00" are to be programmed, the program operation is not performed, and the program operation ends. If bits "01" are to be programmed, the first program resistor Rp1 is selected. If bits "11" are to be programmed, the second program resistor Rp2 is selected. If bits "10" are to be programmed, the third program resistor Rp3 is selected.

In operation S12, a destruction voltage is applied to the antifuse memory cell and a reference current generation unit. If the first program resistor Rp1 is selected, the first reference current Ip1 is generated as a reference current. If the second program resistor Rp2 is selected, the second reference current Ip2 is generated as the reference current. If the third program resistor Rp3 is selected, the third reference current Ip3 is generated as the reference current.

The antifuse memory cell has a very high or infinite resistance due to a gate dielectric layer. Thus, a cell current flowing through the antifuse memory cell is initially 0. Thereafter, as the destruction voltage is applied, the gate dielectric layer of the antifuse memory cell is gradually destroyed, and thus the cell current increases.

In operation S13, an intensity of the cell current is compared to that of the reference current. As the cell current gradually increases, the cell current becomes higher than the reference current. A voltage level of the destruction voltage may increase before the cell current becomes higher than the reference current.

In operation S14, if the cell current becomes higher than the reference current, the destruction voltage is not applied to the antifuse memory cell. Accordingly, the gate dielectric layer of the antifuse memory cell is not destroyed further, and the antifuse memory cell has a uniform resistance value. The destruction voltage is not applied after the cell current becomes higher than the reference current, and thus a cell resistance of an antifuse may have a value lower than that of the reference resistance selected in operation S11. Accordingly, bits may be programmed to the antifuse memory cell.

It may be authenticated whether the antifuse memory cell is properly programmed after operation S15.

In operation S15, a resistor for authenticating whether the antifuse memory cell is properly programmed may be selected. In the case where the antifuse memory cell has the cell distribution of FIG. 4, if bits "01" are programmed, the second read resistor Rr2 may be selected as an authentication resistor. If bits "11" are programmed, the third read resistor Rr3 may be selected as the authentication resistor. If bits "10" are programmed, the cell resistance of the antifuse is lower than the third read resistor Rr3, and thus no authentication process is necessary.

A reference resistance unit of the reference current generation unit according to an exemplary embodiment includes only the program resistors (e.g., the read resistors are omitted). In this embodiment, the program resistors are used as the authentication resistor. For example, if the bits "01" are programmed, the second program resistor Rp2 is selected as the authentication resistor. Also, if bits "11" are programmed, the third read resistor Rr3 is selected as the authentication resistor. If bits "10" are programmed, the authentication process is skipped and the program operation ends.

In operation S16, a read voltage is applied to the antifuse memory cell and the reference current generation unit. If the second read resistor Rr2 is selected, the second reference current Ir2 is generated as an authentication reference current. If the third read resistor Rr3 is selected, the third reference current Ir3 is generated as the authentication reference current.

In operation S17, it is determined whether the cell current is lower than the authentication reference current. If desired bits are programmed to the antifuse memory cell, the cell current is lower than the authentication reference current. However, if the cell current is higher than the authentication reference current, the antifuse memory cell is not properly programmed. That is, although "01" is to be programmed, "11" or "10" is incorrectly programmed instead, or although "11" is to be programmed, "10" is incorrectly programmed instead. Such an error may not be corrected in view of a characteristic of the antifuse memory cell. Accordingly, an address of an incorrectly programmed antifuse memory cell may be reported to a controller, and another antifuse memory cell may be reprogrammed.

Although it is described with reference to FIG. 10 that 2-bit data is programmed in the antifuse memory cell, the inventive concept may be applied in an embodiment where 3 or more bit data is programmed in the antifuse memory cell.

Figure 11:
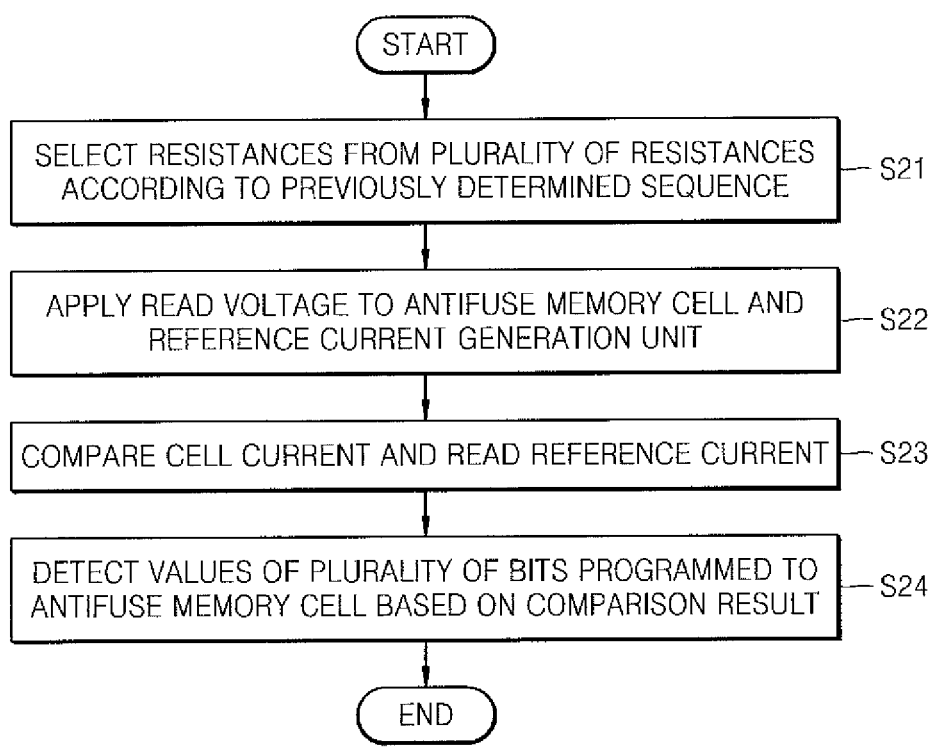
FIG. 11 is a flowchart of a read operation method performed by an antifuse memory device according to an exemplary embodiment of the inventive concept.

FIG. 11 is a flowchart of an operation method performed by an antifuse memory device according to an exemplary embodiment of the inventive concept. In particular, FIG. 11 is a flowchart of a program operation method performed by an antifuse memory device according to an embodiment of the inventive concept.

Referring to FIG. 11, in operation S21, resistors are selected according to a previously determined order from among a plurality of resistors. In an embodiment where an antifuse memory cell has the cell distribution of FIG. 4, the second read resistor Rr2 is firstly selected. Thereafter, the first read resistor Rr1 or the third read resistor Rr3 is selected based on a result of comparing a read reference current, e.g., the second read reference current Ir2, with a cell current when the second read resistor Rr2 is selected. Thus, values of bits programmed to the antifuse memory cell may be detected by performing two comparison operations only.

In operation S22, a read voltage is applied to the antifuse memory cell and a reference current generation unit. If the first read resistor Rr1 is selected, the first read current Ir1 is generated. If the second read resistor Rr2 is selected, the second read reference current Ir2 is generated. If the third read resistor Rr3 is selected, the third read reference current Ir3 is generated.

In operation S23, the cell current is compared to the first through third read reference currents Ir1, Ir2, and Ir3. In operation S24, the values of bits programmed to the antifuse memory cell are detected based on a result of the comparison of operation S23.

It is assumed that the second read resistor Rr2 is firstly selected, and the first read resistor Rr1 or the third read resistor Rr3 is secondly selected. If the cell current is lower than the second read reference current Ir2, "00" or "01" may be detected as the values of bits programmed to the antifuse memory cell. In this embodiment, the first read resistor Rr1 is selected, the cell current is compared to the first read reference current Ir1, and it is determined whether the values of bits programmed to the antifuse memory cell are "00" or "01". More specifically, if the cell current is lower than the first read reference current Ir1, "00" may be determined as the values of bits programmed to the antifuse memory cell. If the cell current is higher than the first read current Ir1, "01" may be determined as the values of bits programmed to the antifuse memory cell.

If the cell current is higher than the second read reference current Ir1, "11" or "10" may be detected as the values of bits programmed to the antifuse memory cell. In this embodiment, the third read resistor Rr3 is selected, the cell current is compared to the third read reference current Ir3, and it is determined whether the values of bits programmed to the antifuse memory cell is "11" or "10". More specifically, if the cell current is lower than the third read reference current Ir3, "11" is determined as the values of bits programmed to the antifuse memory cell. If the cell current is higher than the third read current Ir3, "10" may be determined as the values of bits programmed to the antifuse memory cell.

Also, if a bit to be detected is determined, resistors for determining the bit to be detected are selected. In an embodiment where 2-bit data is programmed in the antifuse memory cell, and an upper bit is to be detected from the 2-bit data, the second read resistor Rr2 is selected. In this embodiment, the upper bit may be detected by performing one comparison operation only. If a lower bit is to be detected from the 2-bit data, the first read resistor Rr1 and the third read resistor Rr3 are selected. In this embodiment, two comparison operations are performed.

Although it is described with reference to FIG. 11 that 2-bit data is read from the antifuse memory cell, the inventive concept may be applied in an embodiment where 3 or more bit data is read from the antifuse memory cell.

The antifuse memory device according to at least one exemplary embodiment of the inventive concept may be solely used. For example, a memory module device may only include the above-described antifuse memory devices. According to an exemplary embodiment, a memory module includes at least one of the antifuse memory devices and at least one of a volatile memory device such as DRAM and a non-volatile memory device such as a flash memory device.

While the inventive concept has been particularly shown and described with reference to exemplary embodiments thereof, it will be understood that various changes in form and details may be made therein without departing from the spirit and scope of the inventive concept.

What is claimed is:

1. An antifuse memory device comprising:
an antifuse memory cell comprising an antifuse;
a reference current generation unit configured to provide a reference current selected from among a plurality of reference currents; and
a comparison unit configured to compare an intensity of a cell current flowing through the antifuse with an intensity of the reference current to provide an output signal indicating a resistance value of the antifuse,
wherein the antifuse memory device applies a destruction voltage to the antifuse until a resistance value of the antifuse corresponds to a desired data to be programmed to the antifuse memory cell based on the output of the comparison unit.

2. The antifuse memory device of claim 1, further comprising: a reference current selection unit configured to select the reference current to correspond to a value of a plurality of bits to be programmed to the antifuse from among the plurality of reference currents.

3. The antifuse memory device of claim 1, further comprising:
a voltage generation unit configured to apply the destruction voltage to a first terminal of the antifuse memory cell in a program operating mode; and
a control unit configured to control the voltage generation unit to prevent the destruction voltage from being applied to the first terminal of the antifuse memory cell when the intensity of the cell current is higher than the intensity of the reference current based on the output signal.

4. The antifuse memory device of claim 3, wherein the control unit controls the voltage generation unit to apply a read voltage to the first terminal of the antifuse memory cell, and indicates whether the plurality of bits are programmed to the antifuse memory cell.

5. The antifuse memory device of claim 3, wherein the reference current generation unit comprises a plurality of resistors corresponding to the plurality of reference currents,
wherein the resistance value of the antifuse to which the plurality of bits are programmed is lower than the reference resistance value of a resistor corresponding to the selected reference current.

6. The antifuse memory device of claim 1, wherein the antifuse memory device prevents application of the destruction voltage to the antifuse when the output signal indicates the cell current is smaller than the reference current, and otherwise applies the destruction voltage to the antifuse.

7. The antifuse memory device of claim 6, wherein the antifuse memory device prevents the application of the destruction voltage by turning off an internal switching transistor and applies the destruction voltage by turning on the internal switching transistor.

8. An antifuse memory device comprising:
an antifuse memory cell comprising an antifuse to which a plurality of bits of data is programmed and a cell transistor connected to the antifuse;
a reference current generation unit comprising a reference resistance unit and a replica cell transistor connected to the reference resistance unit and having a same electrical characteristic as the cell transistor, and configured to provide a reference current determined according to a resistance value of the reference resistant unit; and
a comparison unit configured to compare an intensity of a cell current flowing through the antifuse with an intensity of the reference current to provide an output signal indicating a resistance value of the antifuse; and
a control unit configured to change the resistance value of the reference resistance unit, and determine the data programmed to the antifuse memory cell based on the output signal of the comparison unit.

9. The antifuse memory device of claim 8, further comprising:
at least one address selection transistor connected to the antifuse memory cell and configured to address the antifuse memory cell,
wherein the reference current generation unit further comprises at least one replica selection transistor connected to the replica cell transistor, and having a same electrical characteristic as the at least one address selection transistor.

10. The antifuse memory device of claim 8, wherein the cell transistor and the replica cell transistor have a same transconductance.

11. The antifuse memory device of claim 8, further comprising:
a first node to which the destruction voltage is applied in the program operating mode and the read voltage is applied in the read operating mode; and
a second node to which a ground voltage is applied,
wherein the antifuse and the cell transistor are connected in series to each other between the first node and the second node,
wherein the reference resistance unit and the replica cell transistor are connected in series to each other between the first node and the second node.

12. The antifuse memory device of claim 11, wherein the antifuse comprises a metal oxide semiconductor (MOS) transistor comprising a gate connected to the first node, a floating drain, and a source connected to the cell transistor.

13. The antifuse memory device of claim 12, further comprising:
a switching transistor configured to connect the first node to the gate of the antifuse.

14. The antifuse memory device of claim 13, wherein the reference current generation unit further comprises: a replica switching transistor connected between the reference resistance unit and the first node and having a same electrical characteristic as the switching transistor.

15. The antifuse memory device of claim 13, wherein the reference resistance unit comprises a plurality of resistors and a plurality of switches connected in series to the plurality of resistors, the plurality of resistors connected in parallel through the plurality of switches, wherein each of the plurality of switches comprises a transistor having a same electrical characteristic as the switching transistor.

16. The antifuse memory device of claim 13, wherein the switching transistor is short-circuited such that the destruction voltage is applied to the gate of the antifuse in the program operating mode, and is open when an intensity of a cell current is higher than an intensity of a reference current based on the output signal.

17. The antifuse memory device of claim 16, wherein a voltage level of the destruction voltage gradually increases after the switching transistor is short-circuited until the intensity of the cell current is higher than intensity of the reference current.

18. The antifuse memory device of claim 16, wherein the reference resistance unit has a program resistance value selected from a plurality of program resistance values, wherein the antifuse destroyed in the program operating mode has a resistance value lower than the selected program resistance value.

19. The antifuse memory device of claim 18, further comprising:

a resistance selection unit configured to select a program resistance value corresponding to a value of a plurality of bits to be programmed to the antifuse from the plurality of program resistance values according to the value of the plurality of bits, wherein the value of the plurality of bits is programmed to the antifuse when the antifuse has a resistance value lower than the program resistance value corresponding to the value of the plurality of bits.

20. The antifuse memory device of claim 19, wherein n bit data is programmed to the antifuse, the reference resistance unit has program resistance value from among a $2^n-1$ number of program resistance values, where n is 2 or a natural number greater than 2.

21. The antifuse memory device of claim 11, wherein the reference resistance unit comprises a plurality of read resistors and a read resistance value is selected based on the read resistors in the read operating mode.

22. The antifuse memory device of claim 21, further comprising:

a resistance selection unit configured to select at least one read resistance value from the plurality of read resistance values to read a value of a plurality of bits programmed to the antifuse in the read operating mode; and an encoder unit configured to read and output the value of the plurality of bits programmed to the antifuse based on output signals indicating results of comparing a resistance value of the antifuse with the selected at least one read resistance value.

23. The antifuse memory device of claim 8, wherein the reference current generation unit provides a plurality of read reference currents, wherein the comparison unit compares the intensity of the cell current with intensities of the plurality of read reference currents, and provides outputs signals corresponding to results of the comparing, further comprising:

an encoder unit configured to read and output a value of a plurality of bits programmed to the antifuse based on the output signals.

24. The antifuse memory device of claim 8, wherein the comparison unit comprises:

a first current mirror configured to current-mirror the cell current and generate a first current;

a second current mirror configured to current-mirror the reference current and generate a second current; and a third current mirror configured to current-mirror the second current and generate a third current, and wherein the comparison unit provides the output signal determined according to whether the first current is higher or lower than the third current.

25. The antifuse memory device of claim 8, wherein the comparison unit comprises:

a first current mirror configured to current-mirror the cell current and generate a first current;

a second current mirror configured to current-mirror the reference current and generate a second current;

a third current mirror configured to current-mirror the second current and generate a third current;

a fourth current mirror configured to current-mirror the reference current and generate a fourth current;

a fifth current mirror configured to current-mirror the cell current and generate a fifth current;

a sixth current mirror configured to current-mirror the fifth current and generate a sixth current; and a comparator configured to compare a first output signal determined according to whether the first current is higher or lower than the third current and a second output signal determined according to whether the fourth current is higher or lower than the sixth current, and output the output signal.

26. An antifuse memory device comprising:

an antifuse memory cell comprising an antifuse connected to a source resistor through a node;

a reference voltage generation unit configured to generate a plurality of reference voltages;

a comparison unit configured to compare a voltage of the node with the plurality of reference voltages to generate an output indicating a resistance value of the antifuse; and an encoder unit configured to read and output a value of a plurality of bits programmed to the antifuse memory cell based on results of the compare, wherein the antifuse memory device applies a destruction voltage to the antifuse until a resistance value of the antifuse corresponds to a desired data to be programmed to the antifuse memory cell based on the output of the comparison unit.

27. A method of operating an antifuse memory device, the method comprising:

selecting a resistor from a reference resistance unit comprising a plurality of resistors;

applying a voltage to an antifuse memory cell comprising an antifuse;

applying the voltage to a reference current generation unit comprising the reference resistance unit and generating a reference current corresponding to the selected resistor; and comparing an intensity of a cell current flowing through the antifuse with an intensity of the reference current.

28. The method of claim 27, further comprising halting application of the voltage to the antifuse memory when a result of the comparing indicates the cell current is higher than the reference current.

29. The method of claim 27, wherein the voltage is sufficient to cause dielectric breakdown of the antifuse and the selected resistor indicates a multi-bit pattern to be programmed to the antifuse memory cell.

30. An antifuse memory device comprising:
a voltage generation unit configured to output a programming voltage to program the antifuse memory with a multi-bit pattern;
an antifuse memory cell comprising an antifuse configured to receive the output;
a reference current generation unit configured to receive the output and select one of a plurality of reference currents, wherein each reference current indicates a different multi-bit pattern; and
a control unit configured to prevent application of the programming voltage to the antifuse when cell current flowing through the antifuse is larger than the one reference current,
wherein the programming voltage is at a level sufficient to cause dielectric breakdown within the antifuse.

31. The antifuse memory device of claim 30, further comprising a switching transistor connected between the voltage generation unit and the antifuse memory cell, wherein the control unit turns off the switching transistor to prevent the application of the programming voltage.

32. The antifuse memory device of claim 30, wherein the voltage generation unit is further configured to output a read voltage at a level that is insufficient to cause the dielectric breakdown to read the programmed multi-bit pattern.

* * * * *